United States Patent

Gomikawa et al.

(10) Patent No.: US 7,636,256 B2
(45) Date of Patent: Dec. 22, 2009

(54) SEMICONDUCTOR MEMORY DEVICE

(75) Inventors: Kenji Gomikawa, Yokohama (JP);
Kenji Sawamura, Yokohama (JP);
Mitsuhiro Noguchi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 79 days.

(21) Appl. No.: 11/869,160

(22) Filed: Oct. 9, 2007

(65) Prior Publication Data

US 2009/0003070 A1  Jan. 1, 2009

(30) Foreign Application Priority Data

Oct. 10, 2006  (JP) .............................. 2006-276980

(51) Int. Cl.
*G11C 16/00* (2006.01)
(52) U.S. Cl. .................. 365/185.17; 257/315; 257/370
(58) Field of Classification Search .................. 257/370
See application file for complete search history.

(56) References Cited

U.S. PATENT DOCUMENTS

| 7,456,466 B2* | 11/2008 | Om et al. ..................... 257/315 |
| 2006/0023558 A1 | 2/2006 | Cho et al. |
| 2007/0002622 A1 | 1/2007 | Matsunaga et al. |

* cited by examiner

*Primary Examiner*—Tan T. Nguyen
(74) *Attorney, Agent, or Firm*—Turocy & Watson, LLP

(57) ABSTRACT

A semiconductor memory device includes a memory cell string provided on a semiconductor substrate, and a first select transistor including a gate insulation film, which is provided on the semiconductor substrate having a recess structure which is lower, only at a central portion thereof, than the semiconductor substrate on which the memory cell string is provided, and a gate electrode provided on the gate insulation film, the first select transistor selecting the memory cell string.

19 Claims, 29 Drawing Sheets

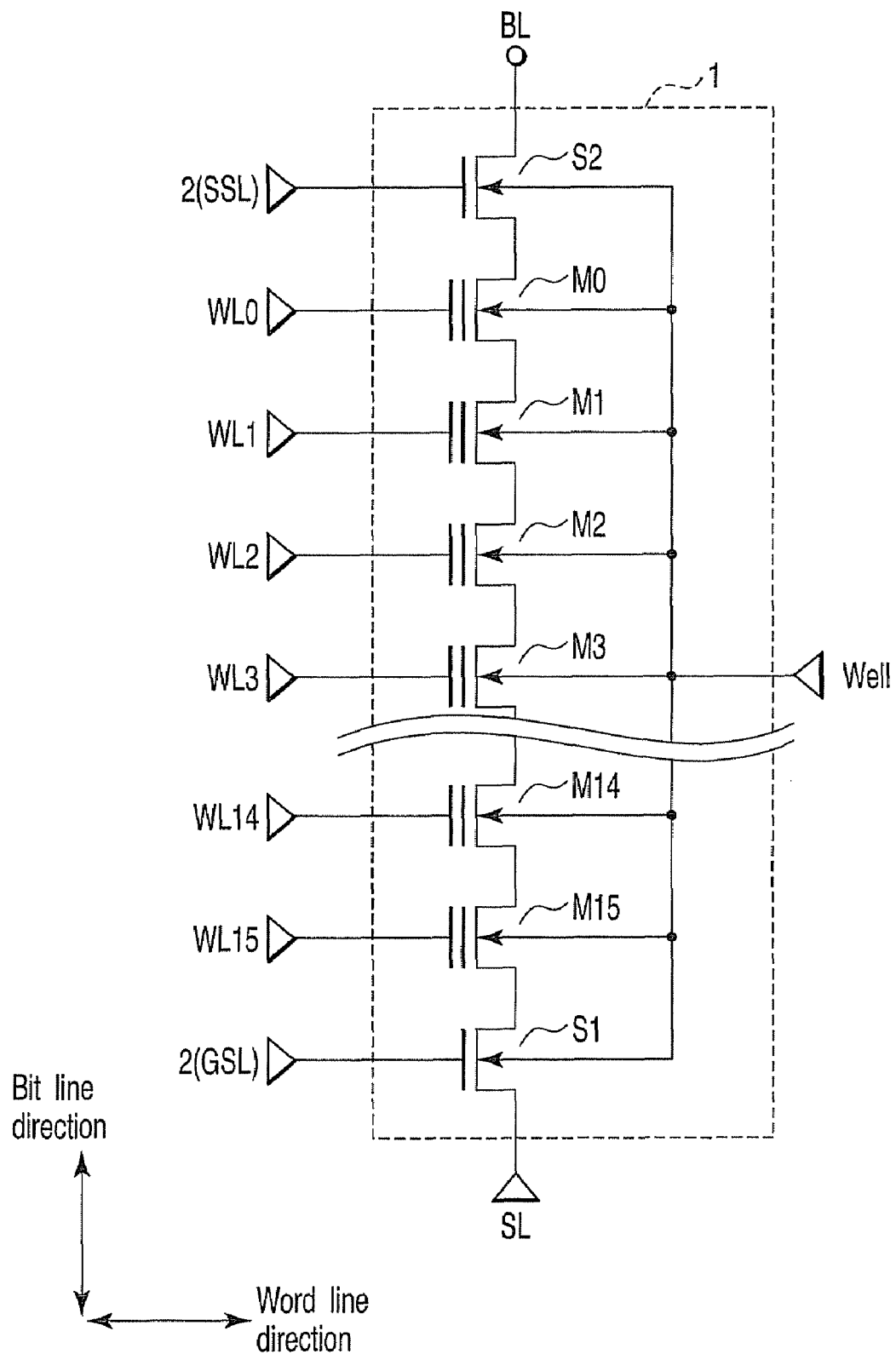
F I G. 1

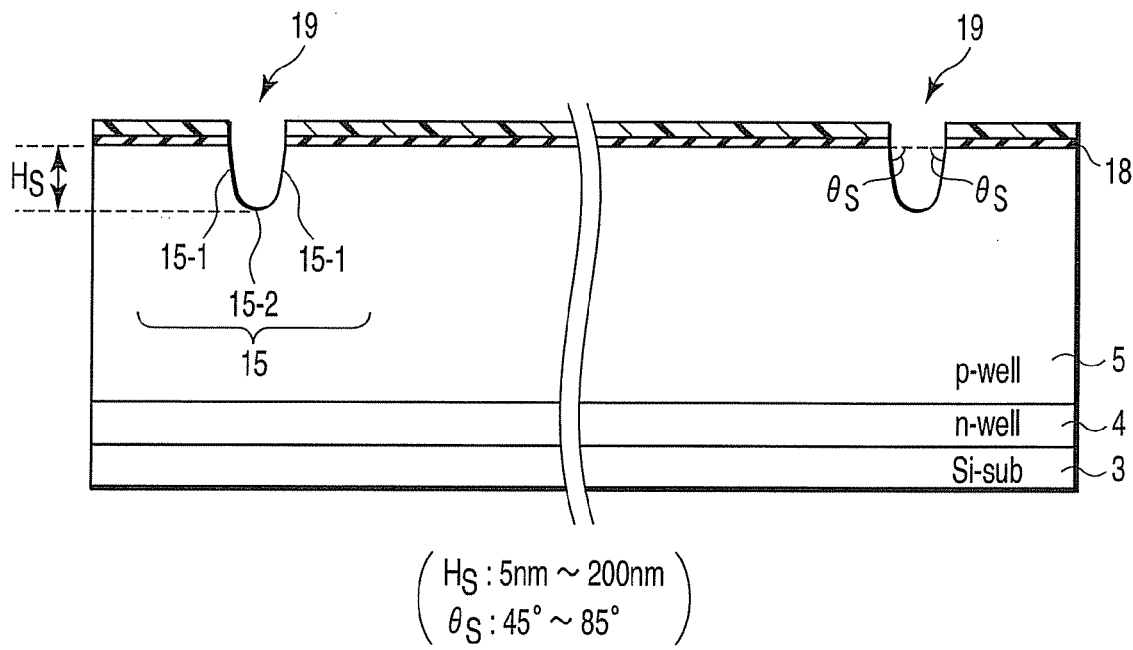
$$\begin{pmatrix} H_S : 5nm \sim 200nm \\ \theta_S : 45° \sim 85° \end{pmatrix}$$
F I G. 13
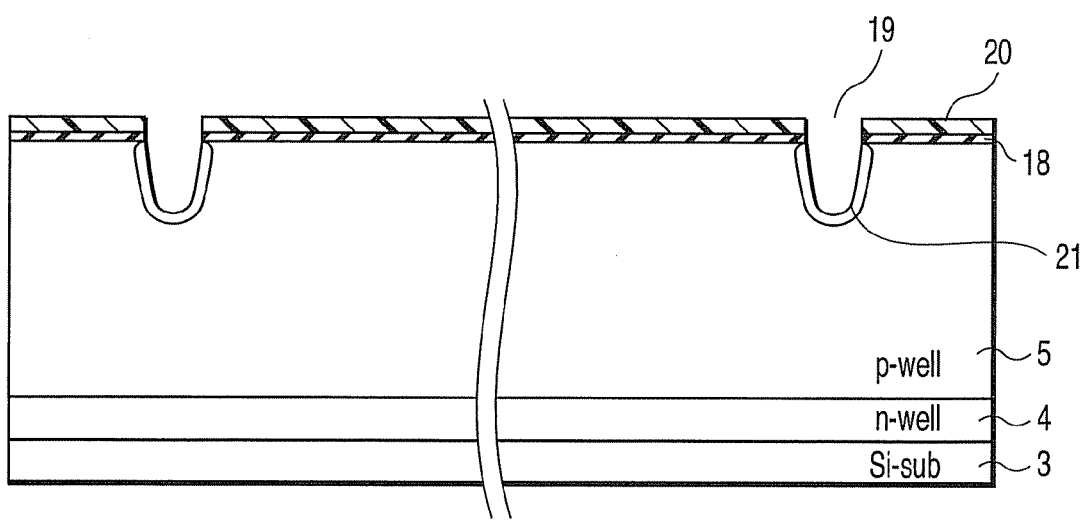
F I G. 14

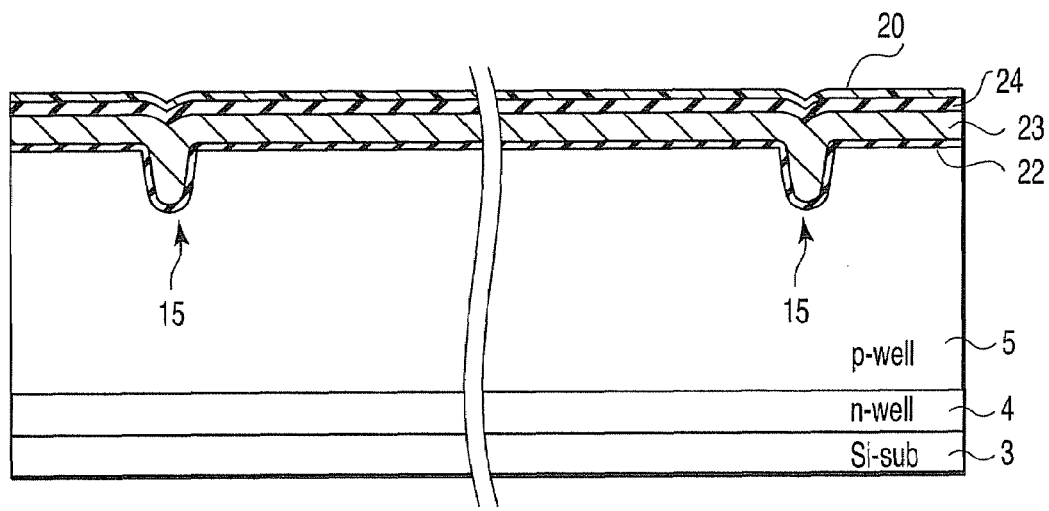
F I G. 1 8 A
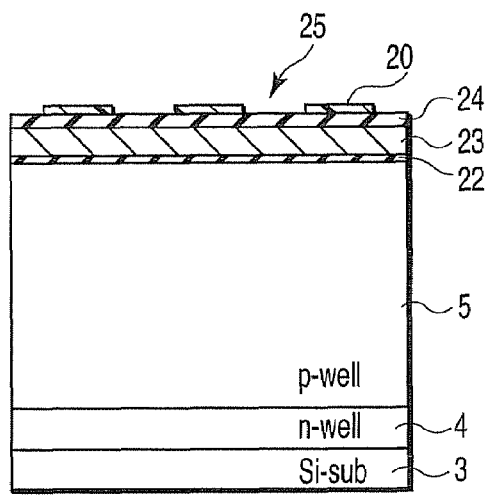
F I G. 1 8 B
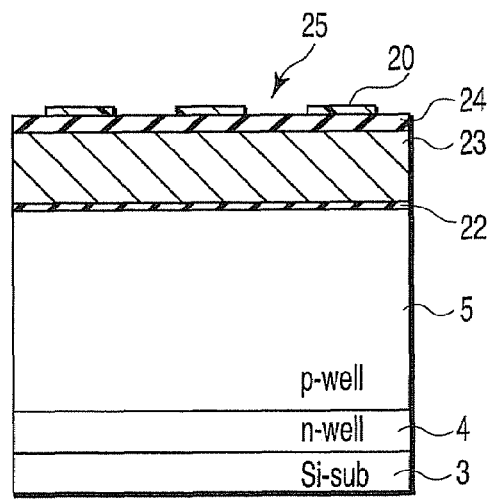
F I G. 1 8 C

Second embodimene (another example of manufacturing method)

($L_{S3}$:8nm)

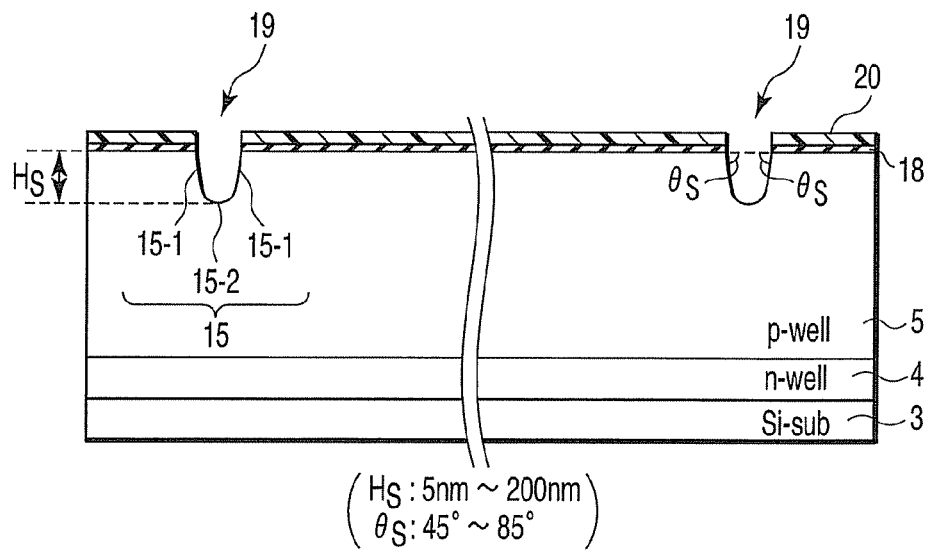
F I G. 2 4
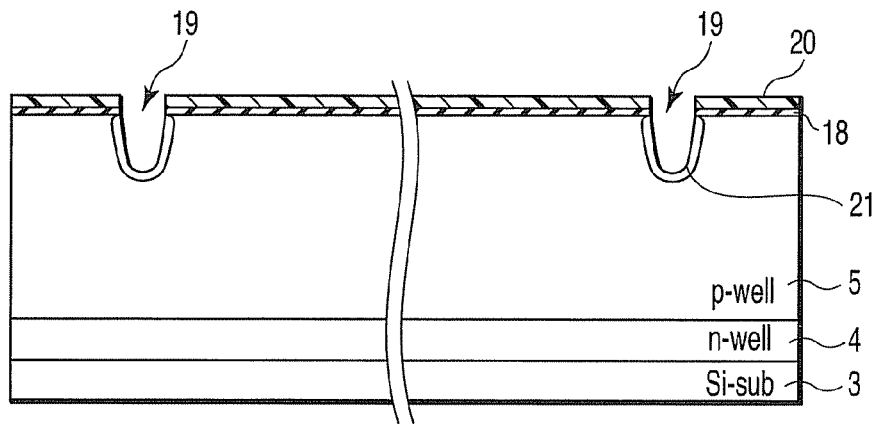
F I G. 2 5
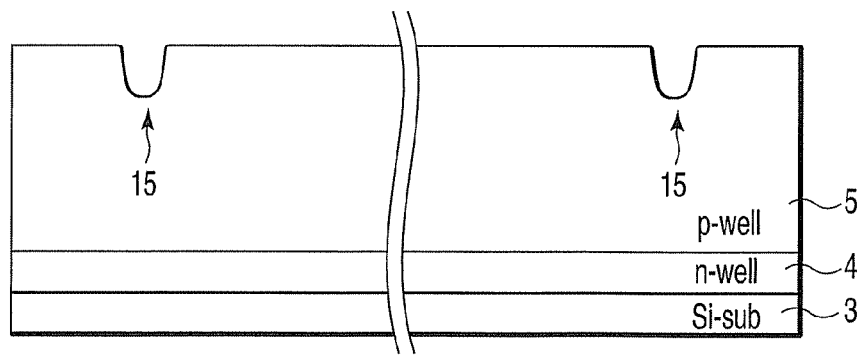
F I G. 2 6

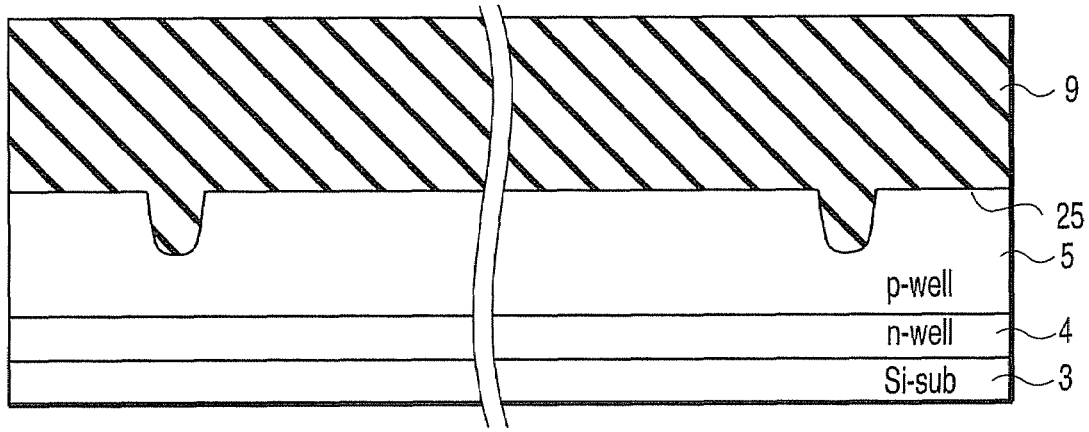
F I G. 3 0 D
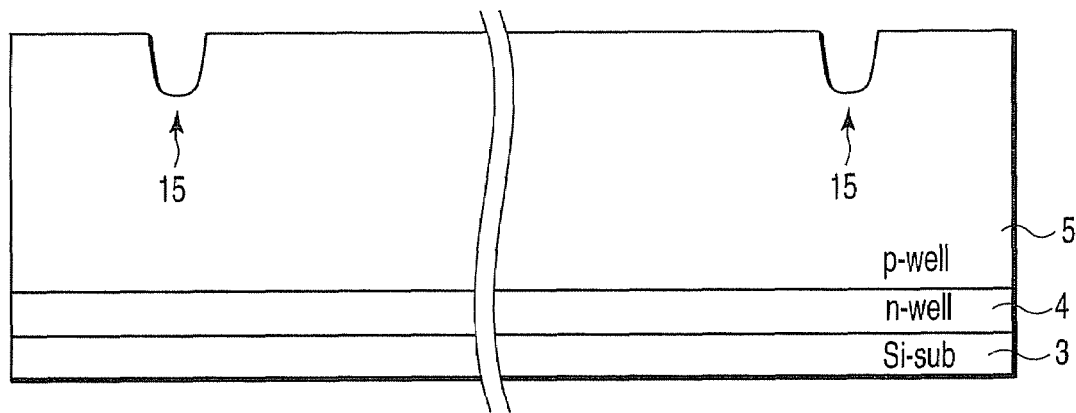
F I G. 3 1 A
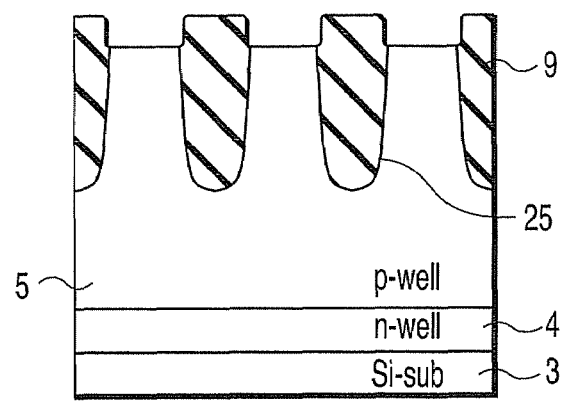
F I G. 3 1 B

Third embodiment (example of transistor having mesa-type gate)

SEMICONDUCTOR MEMORY DEVICE

CROSS-REFERENCE TO RELATED APPLICATIONS

This application is based upon and claims the benefit of priority from prior Japanese Patent Application No. 2006-276980, filed Oct. 10, 2006, the entire contents of which are incorporated herein by reference.

BACKGROUND OF THE INVENTION

1. Field of the Invention

The present invention relates to a semiconductor memory device, and is applied, for example, to a NAND flash memory.

2. Description of the Related Art

There is known a NAND flash memory as an example of semiconductor memory devices which have rapidly been gaining in popularity in recent years. One type of NAND flash memory includes a NAND memory string which is composed of a plurality of memory cells. The NAND memory string is selected by select transistors which are disposed at both ends of the NAND memory string. US 2006/0023558 A1, for instance, discloses an example of the NAND memory string and select transistors.

The select transistors function to cut off an operation voltage, such as a write voltage, which is transferred to the NAND memory string, for example, when data is written in memory cell transistors. Although the size of each memory cell transistor has been reduced and the area occupied by each memory cell transistor has been reduced from generation to generation, the operation voltage at the time of write/erase/read operations has not been decreased.

Under the circumstances, unlike the memory cell transistors, the size of each select transistor, which is required to cut off the operation voltage that is transferred to the NAND memory string, is not made finer, and the reduction in size of each select transistor is restricted in order to maintain the cut-off characteristics. For example, in the case where the gate length of the memory cell transistor is about 90 nm, the channel length of the select transistor needs to be 150 nm to 250 nm or more in order to obtain sufficient cut-off characteristics.

As described above, as regards the conventional semiconductor memory device, there is a tendency that if the area of occupation by the select transistor is reduced, the cut-off characteristics deteriorate, and the conventional semiconductor memory device is disadvantageous in terms of microfabrication.

BRIEF SUMMARY OF THE INVENTION

According to an aspect of the present invention, there is provided a semiconductor memory device comprising: a memory cell string provided on a semiconductor substrate; and a first select transistor including a gate insulation film, which is provided on the semiconductor substrate having a recess structure which is lower, only at a central portion thereof, than the semiconductor substrate on which the memory cell string is provided, and a gate electrode provided on the gate insulation film, the first select transistor selecting the memory cell string.

According to another aspect of the present invention, there is provided a semiconductor memory device comprising: a memory cell string provided on a semiconductor substrate; and a first select transistor including a gate insulation film, which is provided on the semiconductor substrate having a mesa structure which is higher, only at a central portion thereof, than the semiconductor substrate on which the memory cell string is provided, and a gate electrode provided on the gate insulation film, the first select transistor being connected to one end of a current path of the memory cell string.

BRIEF DESCRIPTION OF THE SEVERAL VIEWS OF THE DRAWING

FIG. 1 is a circuit diagram showing a NAND memory string in a semiconductor memory device according to a first embodiment of the present invention;

FIG. 13 is a cross-sectional view illustrating a fabrication step of the semiconductor memory device according to the first embodiment;

FIG. 14 is a cross-sectional view illustrating a fabrication step of the semiconductor memory device according to the first embodiment;

FIG. 18A is a cross-sectional view, taken along line A-A in FIG. 2, illustrating a fabrication step of the semiconductor memory device according to the first embodiment;

FIG. 18B is a cross-sectional view taken along line B-B in FIG. 2;

FIG. 18C is a cross-sectional view taken along line C-C in FIG. 2;

FIG. 24 is a cross-sectional view illustrating a fabrication step of the semiconductor memory device according to the second embodiment;

FIG. 25 is a cross-sectional view illustrating a fabrication step of the semiconductor memory device according to the second embodiment;

FIG. 26 is a cross-sectional view illustrating a fabrication step of the semiconductor memory device according to the second embodiment;

FIG. 30D is a cross-sectional view taken along line D-D in FIG. 2;

FIG. 31A is a cross-sectional view, taken along line A-A in FIG. 2, illustrating a fabrication step of the semiconductor memory device according to the second embodiment;

FIG. 31B is a cross-sectional view taken along line B-B in FIG. 2;

DETAILED DESCRIPTION OF THE INVENTION

Figure 2:
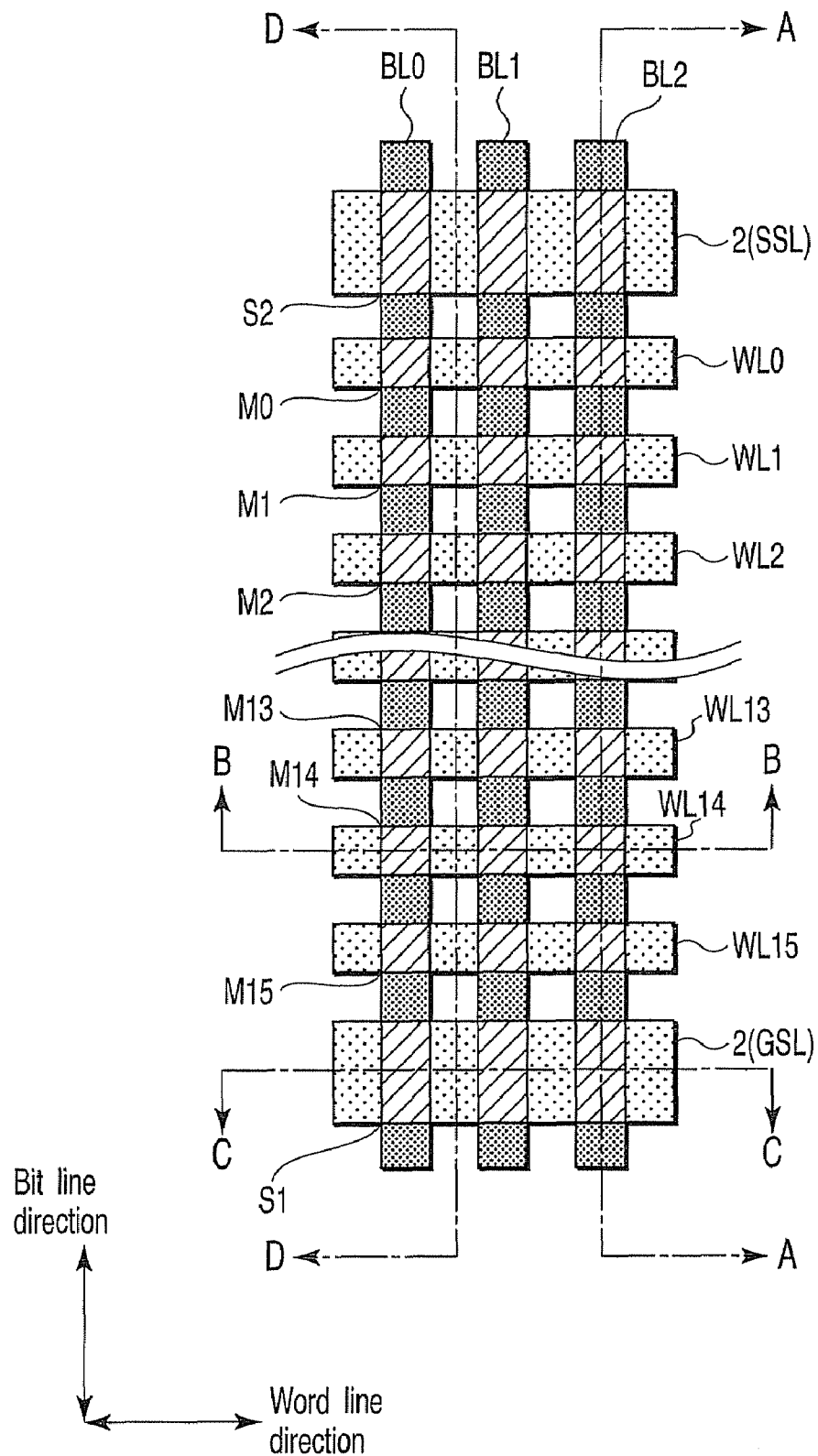
FIG. 2 is a plan view showing the semiconductor memory device according to the first embodiment.

Embodiments of the present invention will now be described with reference to the accompanying drawings. In the description below, common parts are denoted by like reference numerals throughout the drawings.

First Embodiment

An Example of a Select Transistor Including a Recess Structure

To begin with, referring to FIG. 1 to FIG. 4, the structure of a semiconductor memory device according to a first embodiment of the present invention is described. This embodiment relates to a select transistor having a recess structure in which only a central portion of the select transistor is lowered. A NAND flash memory is described as an example of the semiconductor memory device. FIG. 1 is an equivalent circuit diagram showing a NAND memory string according to the first embodiment. FIG. 2 is a plan view of the NAND memory string according to this embodiment. FIG. 3A to FIG. 3C are cross-sectional views taken along line A-A, line B-B and line C-C in FIG. 2, respectively.

<1-1. Example of Structure of the Semiconductor Memory Device>

As shown in the Figures, the NAND flash memory (NAND-type EEPROM) includes a plurality of NAND memory strings 1, and select transistors S1 and S2 which select the NAND memory strings 1.

The NAND memory string 1 includes memory cell transistors M0 to M15 each having a MISFET structure, which are provided at intersections where element regions interposed between element separation regions, and word lines WL0 to WL15 intersect. The sources/drains of the memory cell transistors M0 to M15, which constitute a current path of the memory cell transistors M0 to M15, are connected in series. One end of the current path is connected to the bit line BL via the select transistor that is composed of a MISFET, and the other end of the current path is connected to a common source line SL via the select transistor that is composed of a MISFET.

Figure 3A:
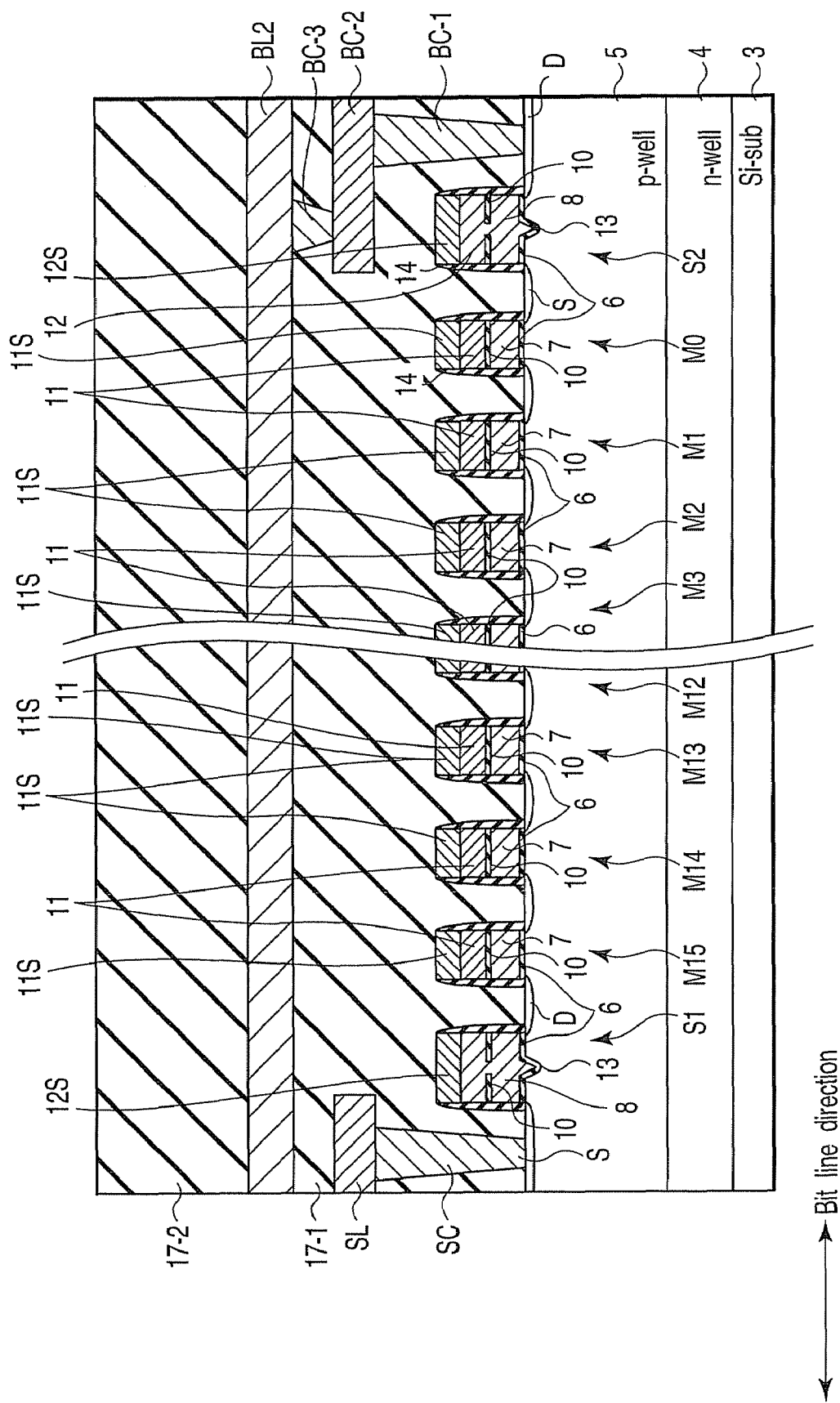
FIG. 3A is a cross-sectional view taken along line A-A in FIG. 2.

As is shown in FIG. 3A, each of the memory cell transistors M0 to M15 has a stacked-layer structure which includes a tunnel insulation film 6 provided on a P-type well (p-well) 5; a floating electrode 7 provided on the tunnel insulation film 6; an inter-gate insulation film 10 provided on the floating electrode 7; a control electrode 11 provided on the inter-gate insulation film 10, and a silicide layer 11S provided on the control electrode 11. The floating electrodes 7 of the memory cell transistors M0 to M15 are electrically isolated from each other. The control electrodes 11 are connected to the word lines WL0 to WL15, and the control electrodes 11 of the memory cell transistors, which are arranged along each word line, are electrically commonly connected.

In addition, each of the memory cell transistors M0 to M15 includes spacers 14 which are provided along side walls of the above-described stacked-layer structure, and a source S and a drain D which are provided in the P-type well 5 so as to sandwich the stacked-layer structure.

The select transistor S1, S2 is provided on a semiconductor substrate 5 having a recess structure 15 which is lower, only at a central portion thereof, than the semiconductor substrate 5 on which the NAND memory string is provided. The select transistor S1, S2 includes a gate insulation film 13, an inter-gate insulation film 10, a gate electrode 12 and a silicide layer 12S. The inter-gate insulation film 10 is provided in the gate electrode 12, and a central portion of the inter-gate insulation film 10 is split so as to electrically connect upper and lower layers of the inter-gate insulation film 10.

The gate insulation film 13 is provided on the recess structure 15, which will be described later in detail, and continuously onto the semiconductor substrate 5. The recess structure 15 is provided at a position below the opening part of the inter-gate insulation film 10.

The gate electrode 12 is provided on the gate insulation film 13. Thus, the select transistor S1, S2 according to the present embodiment has a recess gate structure which is lowered only at a central part thereof.

The silicide layer 12S is provided on the gate electrode 12.

In addition, each of the select transistors S1 and S2 includes spacers 14 which are provided along side walls of the gate electrode 12, and a source S and a drain D which are provided in the P-type well 5 so as to sandwich the gate electrode 12.

As shown in FIG. 2, the select transistors S1 and S2 have the gate electrodes 12 connected to select gate lines 2 (SSL) and 2 (GSL), i.e. block selection lines SSL and GSL, so that the select transistors S1 and S2 may select the NAND memory string 1 extending in the bit line BL direction, and may connect the selected NAND memory string 1 to the bit line BL.

The select gate lines SSL and GSL are formed of conductors in the same layer as the control electrodes 11 and floating electrodes 7, and are electrically connected in the word line WL direction (row direction) of the memory cell array.

Further, the memory cell transistor M0 to M15 and the select transistors S1 and S2 are covered by the interlayer insulation films 17-1 and 17-2. The bit lines BL0 to BL2 are provided in interlayer insulation films 17-1 and 17-2. The bit line, BL0 to BL2, is electrically connected to the drain D of the select transistor S2 via bit line contacts BC-1 to BC-3 provided in the interlayer insulation film 17-1.

The source S of the select transistor S1 is connected to the source line SL via a source line contacts SC provided in the interlayer insulation film 17-1.

In the NAND memory string 1, it should suffice if at least one select gate line SSL and one select gate line GSL are provided. In this embodiment, 16 ($=2^4$) memory cell transistors are connected in the NAND memory string 1. However, it should suffice if the number of memory cells in the NAND memory string 1 is two or more. From the standpoint of address decoding, it is preferable that the number of memory cells be $2^n$ (n=a positive integer).

Figure 3B:
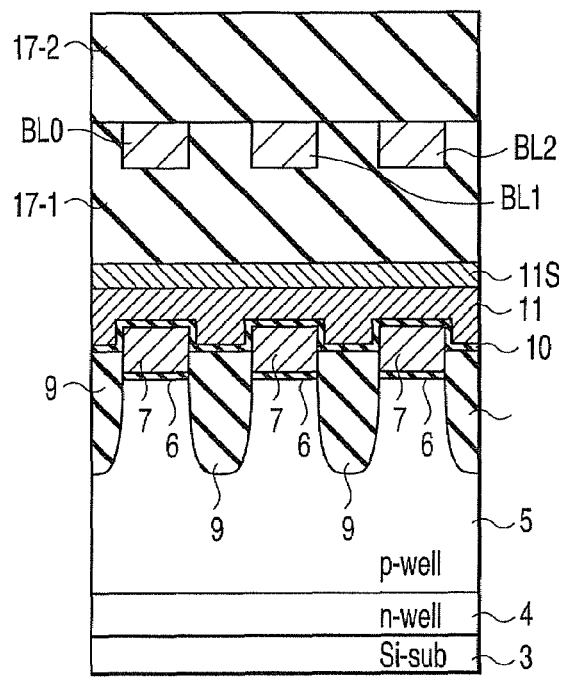
FIG. 3B is a cross-sectional view taken along line B-B in FIG. 2.
Figure 3C:
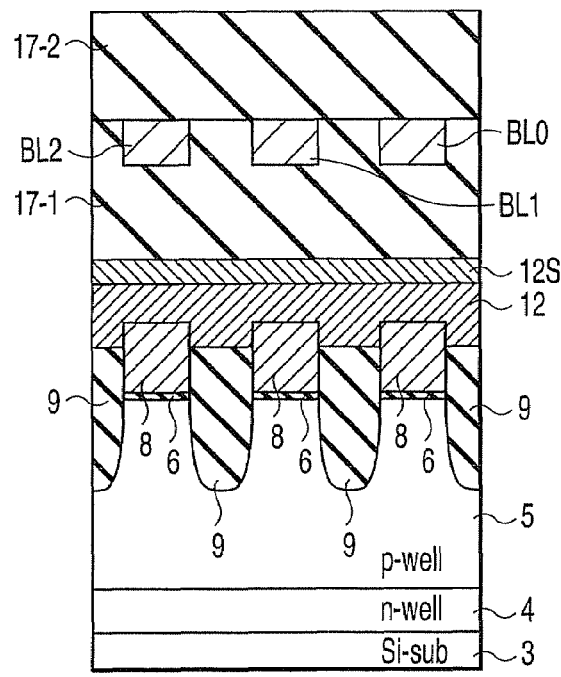
FIG. 3C is a cross-sectional view taken along line C-C in FIG. 2.

As shown in FIG. 3A to FIG. 3C, as regards the NAND memory string 1, an N-type well (n-well) 4 is provided in a P-type silicon substrate (Si-sub) 3, and a P-type well (p-well) 5 is provided in the silicon substrate 3 above the N-type well (n-well) 4.

The P-type well 5 is formed such that a boron concentration, for instance, is set at about $10^{14}$ cm$^{-3}$ to $10^{19}$ cm$^{-3}$. The P-type well 5 is electrically isolated from the P-type silicon substrate 3 by the N-type well 4, and voltage can be applied independently to the P-type well 5. Accordingly, the load on the boost circuit at the time of erasure can be reduced, and power consumption can be suppressed.

The tunnel insulation film 6 is provided on the P-type well 5 and is formed of, e.g. a silicon oxide film or an oxynitride film with a thickness of about 3 nm to 15 nm.

The floating electrode 7 and the gate electrodes 12 (SSL) and 12 (GSL) of the select transistors S1 and S2 are formed of, e.g. polysilicon in which phosphorus or boron is doped at a concentration of about $10^{18}$ cm$^{-3}$ to $10^{21}$ cm$^{-3}$, with a thickness of about 10 nm to 500 nm.

For example, the tunnel insulation film 6 and gate insulation film 13 may be formed at the same time. In this case, they are formed of the same material and have substantially the same thickness on a horizontal plane of the semiconductor substrate.

The floating electrode 7 is formed in a device formation region which is divided by a device isolation insulation film 9 that is formed of a silicon oxide film.

As will be described later, the floating electrode 7 is formed in the following manner. For example, a material film of the floating electrode 7 is deposited on the entire surface of the P-type well 5 via the tunnel insulation film 6. Subsequently, the deposited material film is patterned, and the P-type well 5 is etched to a depth of about 0.05 to 0.5 μm. The device isolation insulation film 9 is buried in the etched part. Thereby, the floating electrode 7 may be formed on the planar surface with no stepped part.

However, the gate electrodes 12 (SSL) and 12 (GSL), which are formed of the same material as the floating electrode 7, are continuously formed in the row direction of the cell array, and become select gate lines SSL and GSL.

The inter-gate insulation film 10 is provided on the floating electrode 7 and is formed of, e.g. a silicon oxide film, an oxynitride film or a stacked-layer film of a silicon oxide film/silicon nitride film/silicon oxide film, with a thickness of about 5 nm to 30 nm. Alternatively, the inter-gate insulation film 10 may be formed of an NONON film in which an ONO structure is interposed between silicon nitride films, or a film including a high-dielectric-constant material, such as an $Al_2O_3$ film, an HfAlO film or an $HfSiO_x$ film.

The control electrode 11 and gate electrodes 12 (SSL) and 12 (GSL) are formed of, for instance, polysilicon in which phosphorus, arsenic or boron is doped at a concentration of about $10^{17}$ $cm^{-3}$ to $10^{21}$ $cm^{-3}$, WSi (tungsten silicide), a stacked structure thereof with polysilicon, or a stacked structure of NiSi, MoSi, TiSi or CoSi with polysilicon. In this case, the film thickness is, e.g. about 10 nm to 500 nm.

In the above description, a single NAND memory string 1 has been described. In normal cases, however, a plurality of such NAND memory strings 1 are arranged in the bit line direction and word line direction, thereby constituting the memory cell array. The bit lines BL are connected at one end to a sense amplifier and at the other end to a data latch circuit.

The range of a plurality of NAND memory strings 1 in the word line WL direction constitutes one block that is a unit of batch data erasure. A plurality of memory cell transistors arranged in the direction of one word line WL constitute one page that is a unit of data write and data read.

<1-2. An Example of Structure of the Select Transistor S1, S2>

Figure 4:
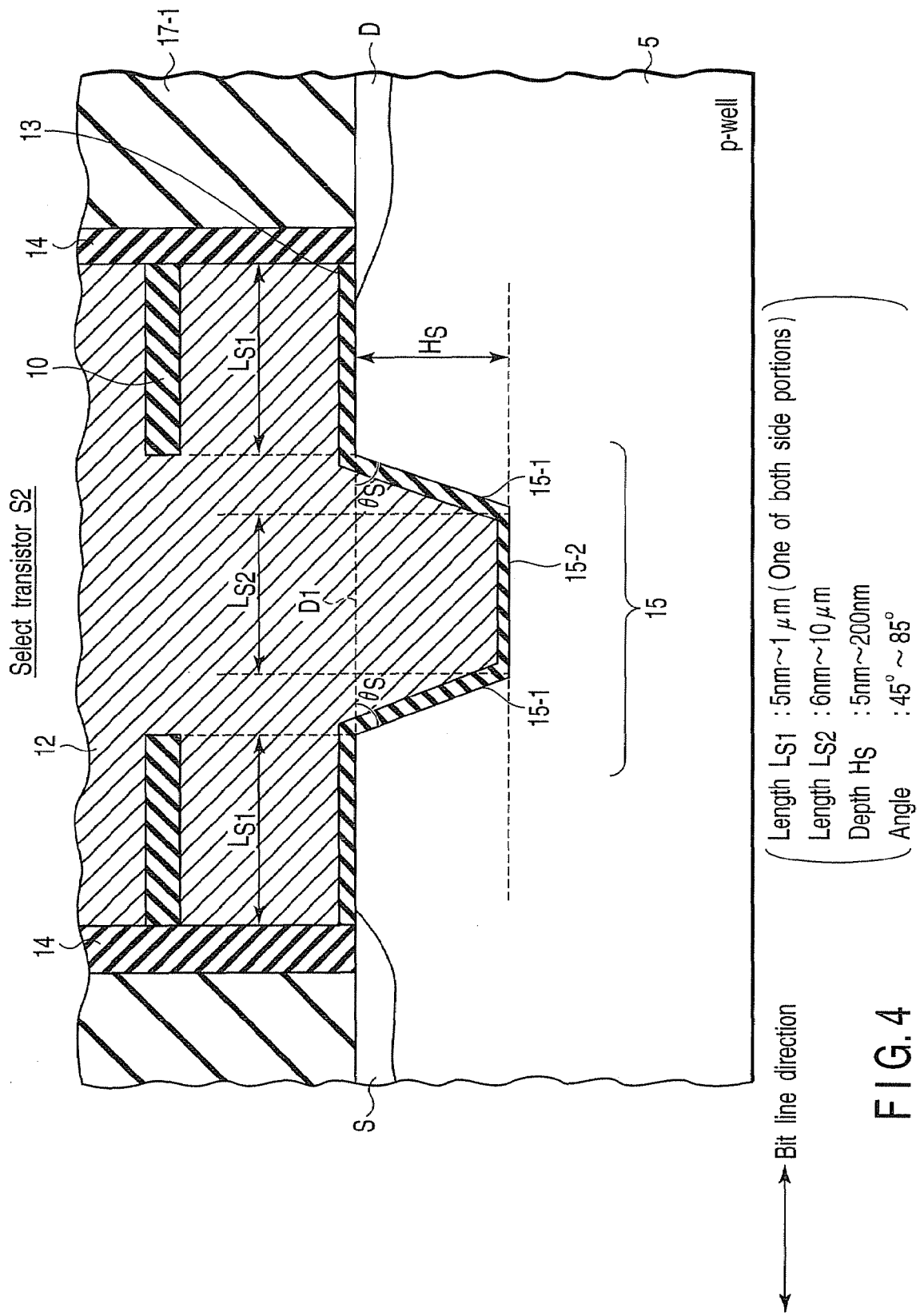
FIG. 4 is a cross-sectional view showing the vicinity of a select transistor in the first embodiment.

Next, the structure of the select transistor S1, S2 is described in greater detail, with reference to FIG. 4. The select transistor S2 is described below by way of example.

As is shown in FIG. 4, the select transistor S2 is provided on the semiconductor substrate (P-type well) 5 which has the recess structure 15 that is lower, only at a central portion thereof, than the semiconductor substrate 5 on which the NAND memory string 1 is provided. The gate insulation film 13 is provided on the semiconductor substrate 5 including the recess structure 15. Thus, the effective channel length of the select transistor S2 can be increased, and the area of occupation by the select transistor S2 can be decreased.

1-2-1. Position of Recess Structure 15 (at a Central Portion of the Select Transistor)

As described above, the recess structure 15 is provided only at a central portion of the select transistor S2, that is, at a central portion of between the source S and drain D.

Thus, even if misalignment occurs between the position of the recess structure 15 and the position of the gate electrode 12 at the time of the lithography step for forming the gate electrode 12, a variation in channel length can be suppressed and the cut-off characteristics can be improved.

The reason for this is that in the case where the recess structure 15 is provided on the entire semiconductor substrate 5 on which the select transistor S2 is provided, if misalignment occurs between the position of the recess structure 15 and the position of the gate electrode 12, the channel length would greatly vary.

In the case where the length Ls2 of a bottom surface 15-2 of the recess structure is increased to the same length as the channel length of the select transistor S2 and the recess structure 15 is provided on the entire semiconductor substrate 5 on which the select transistor S2 is provided, it is considered that the effective channel length can be made greater. However, as described above, if misalignment occurs between the position of the recess structure 15 and the position of the select transistor S2, such a case may occur that not only the variation in channel length increases but also the gate electrode 12 cannot be formed.

Figure 11:
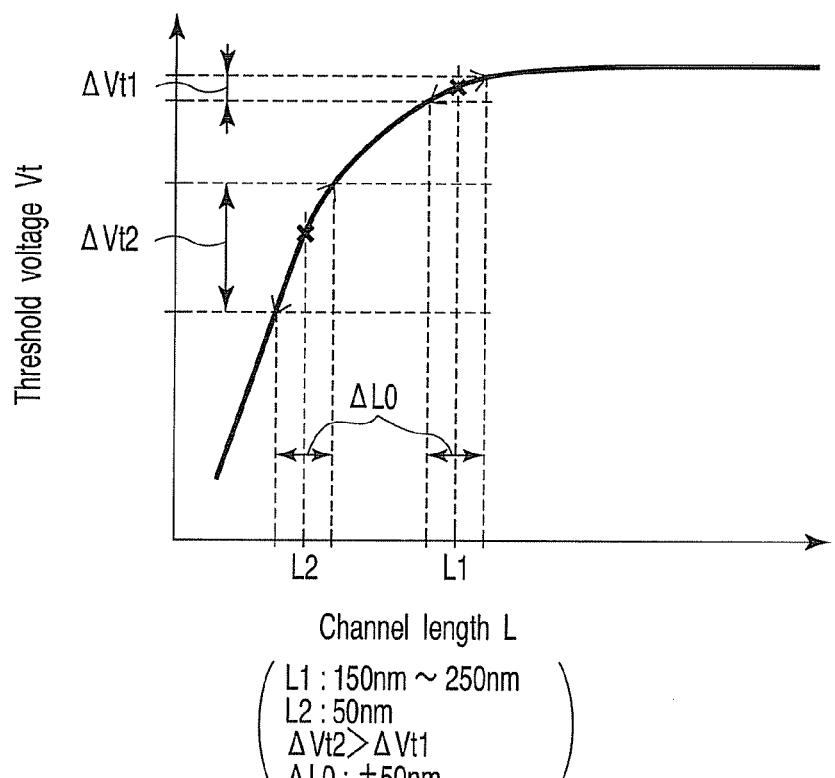
FIG. 11 is a graph showing the relationship between a channel length L and a threshold voltage Vt in the semiconductor memory device according to the first embodiment.

On the other hand, as shown in FIG. 11 that is to be described later, even in the case where the recess structure 15 is provided only at the central portion, the effective channel length can sufficiently be increased (e.g. about 1.28 times to 8 times) and the cut-off characteristics can be improved.

1-2-2. Position of the Recess Structure 15 (a Position Below the Opening Part of the Inter-Gate Insulation Film 10)

The recess structure 15 is provided in the substrate 5 at a position that is substantially immediately below the split part of the inter-gate insulation film (IPD insulation film) 10.

Thus, as described in the above section 1-2-1, the recess structure 15 can surely be formed at a position (at a substantially central position) apart from the end of the gate electrode 12, and occurrence of misalignment can be prevented.

Moreover, since the same mask can be used when the recess structure 15 is formed (in a step of FIG. 13 to be described later) and the inter-gate insulation film (inter-poly insulation film) 10 is split, the manufacturing cost can be reduced.

As regards other transistors of peripheral circuits, the same recess structure may be formed and the area of occupation by peripheral circuits can be reduced.

1-2-3. The Lengths Ls1 and Ls2 and Angle θs of the Recess Structure

It is desirable that the length Ls1 (the length between one end of the gate electrode 12 and the recess structure 15) in the channel length of the semiconductor substrate surface, on which the select transistor S2 is provided and from which the recess structure 15 is excluded, be 5 nm or more. It is preferable that the upper limit of the length Ls1 be 1 μm or less. The reason for this is that it is preferable that the length Ls1 be set at a greater value within a proper range, from the standpoint of prevention of misalignment. However, it should suffice if only one of the lengths Ls1 of both side portions falls within the above range. It is not necessary that the lengths Ls1 of both side portions fall within the above range.

If the length Ls1 between one end of the gate electrode 12 and the recess structure 15 is set at 5 nm or more, the cut-off characteristics can be improved even if misalignment occurs as in the case of the above section 1-2-1.

Moreover, it is preferable that the length Ls2 in the channel direction of the bottom surface 15-2 of the recess structure be set at 6 nm or more. Preferably, the upper limit of the length Ls2 should be set at 10 μm or less. The reason for this is that it is preferable that the length Ls2 be set at a greater value within a proper range, from the standpoint of prevention of depletion of the recess structure 15.

Depletion layers formed in the gate electrodes 12 on side surfaces 15-1 of the recess structure are connected to each other when a high voltage is applied, and therefore the gate electrode 12 surrounded by the side surfaces 15-1 and bottom surface 15-2 of the recess structure is completely depleted. However, if the length Ls2 of the bottom surface 15-2 of the recess structure meets the above range, it is possible to prevent the recess portion from being completely depleted at the time of high voltage application.

The depth Hs of the bottom surface 15-2 of the recess structure from the surface of the semiconductor substrate 5 should preferably be 5 nm to 200 nm. By setting the depth Hs within this range, it becomes possible to obtain a desired practical channel length increase effect (e.g. about 1.28 times to 8 times).

It is desirable that the angle θs of an oblique surface 15-1 of the recess structure be set between 45° and 85°. The predetermined angle θs is an angle between a direction D1 along the surface of the semiconductor substrate 5 and a direction along the recess structure oblique surface 15-1.

The reason for this is that if the angle θs is 85° or more (e.g. about 90°), the channel of the select transistor S2 would be bent substantially at right angles, and the cut-off effect would decrease.

On the other hand, if the angle θs is 45° or less (e.g. about 30°), the recess structure 15 would become closer to a planar structure, the effective channel length would decrease, and the sufficient cut-off effect could not be obtained.

<2. Operation>

Next, the operation of the semiconductor memory device according to the present embodiment is described with reference to FIG. 5 to FIG. 11.

A data erase operation of the NAND flash memory is normally executed in units of a block, and a data write operation and a data read operation are executed in units of a page. In this description, it is assumed that a state with a low threshold value, in which electrons are released from the floating electrode 7, is "1" data (erase state), and a state with a high threshold value, in which electrons are injected in the floating electrode 7, is "0" data.

2-1. Read Operation and Erase Operation

To begin with, a data read operation of the NAND flash memory is described. When data is read out, a read voltage for executing threshold determination is applied to the control electrode 11 of a selected memory cell transistor M. On the other hand, a pulse voltage, which is higher than the read voltage and turns on the current path regardless of data, is applied to the control electrodes 11 of the other non-selected memory cells M. A "read current", which flows through the NAND memory string 1, is detected by a sense amplifier (not shown).

The erase operation is executed batchwise in units of a block, by applying a positive voltage to a P-type well in the block, and releasing electrons from the floating electrodes 7 to the substrate (P-type well) 5.

2-2. "1" Data Write Operation

Next, a "1" data write operation is described with reference to FIG. 5 to FIG. 7. In this description, it is assumed, for example, that "1" data is written in the memory cell transistor M8. The "1" data write operation is, in other words, an operation in which no electrons are injected in the floating electrode 7 of the memory cell transistor M8.

Figure 5:
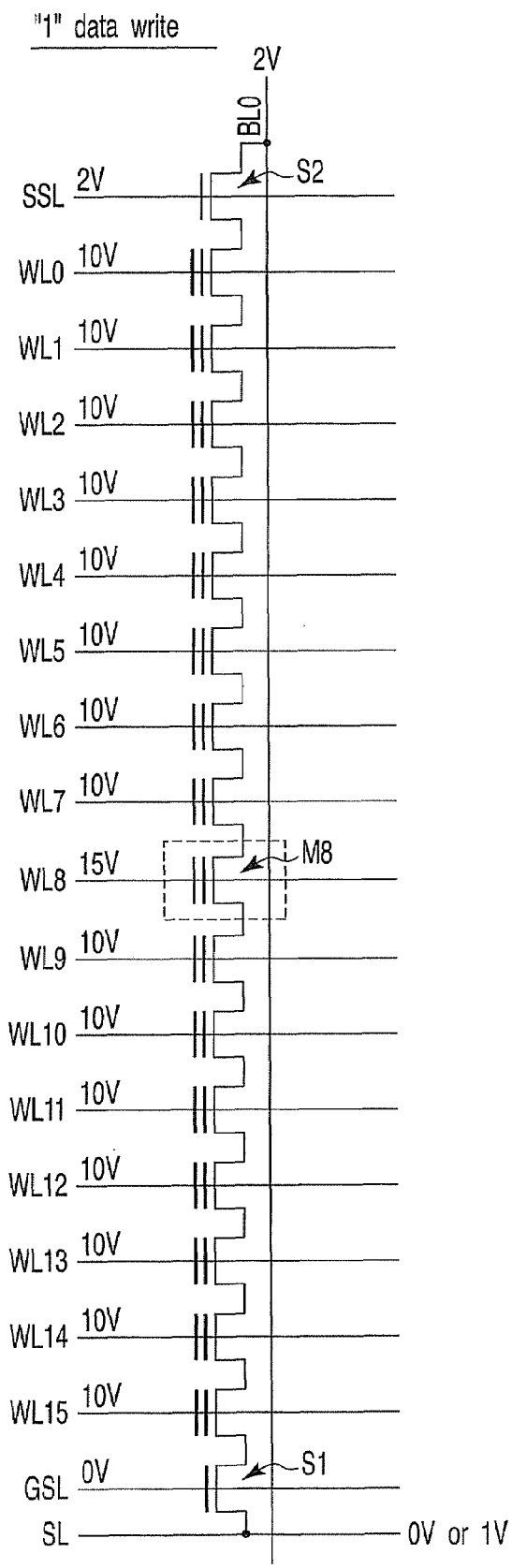
FIG. 5 is a circuit diagram for explaining "1" data write in the semiconductor memory device according to the first embodiment.

As shown in FIG. 5, the word lines WL0 to WL15, select gate lines GSL and SSL, bit line BL and common source line SL are grounded at 0V.

A voltage, e.g. 4V, which is sufficiently higher than the threshold value of the select transistor S2, is applied to the select gate line SSL of the select transistor S2 that is connected on the bit line BL side. Accordingly, the select transistor S2 is set in the ON state.

Subsequently, a voltage, e.g. 2V, which is substantially equal to the threshold voltage of the select transistor S2, is applied to the bit line BL. At this time, since the select transistor S2 is in the ON state, the voltage of the bit line BL is transferred to the entire NAND memory string 1. At this time, since the select gate line GSL of the select transistor S1, which is connected on the common source SL side, is at 0V, the select transistor S2 is in the OFF state and the channel potential of the memory cell transistors M0 to M15 between the select transistors S1 and S2 becomes equal to the potential of the bit line BL.

Thereafter, the voltage of the select gate line SSL is lowered to a level substantially equal to the threshold of the select transistor S2, for example, about 2V.

Subsequently, a voltage, e.g. about 10V, which is lower than the write threshold value of the memory cell transistor but is sufficiently high, is applied to the non-selected word lines WL0 to WL7 and WL9 to WL15, and a voltage, e.g. about 15V, which is higher than the write threshold value of the memory cell transistor, is applied to the selected word line WL8.

Then, the channel potential of the memory cell transistors M0 to M15 rises due to coupling, and the select transistor S2 is set in the OFF state with a substrate bias being applied to the select transistor S1. The channel within the memory string 1, in which the select transistors S1 and S2 at both ends are in the OFF state, is set in the floating state. Consequently, such a potential difference as to be capable of executing data write between the channel and word line does not occur in the memory cell transistor M8 in which data write is executed. Thereby, no electrons are injected in the floating electrode 7 of the memory cell transistor M8, and the "1" write operation is executed.

Figure 6:
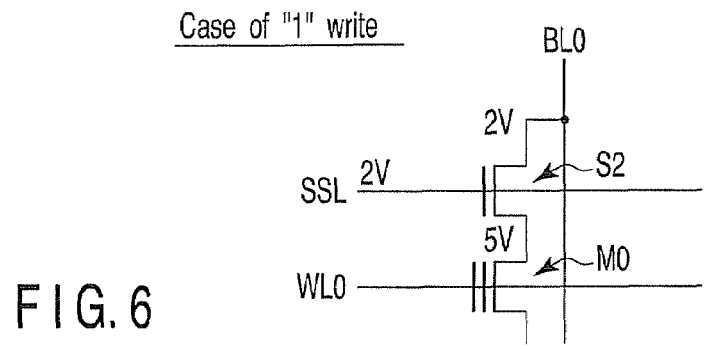
FIG. 6 is a circuit diagram showing the vicinity of a select transistor S1 at the time of "1" data write in FIG. 5.
Figure 7:
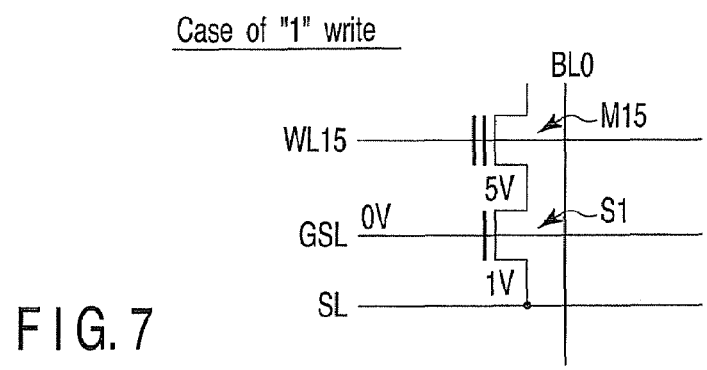
FIG. 7 is a circuit diagram showing the vicinity of a select transistor S2 at the time of "1" data write in FIG. 5.

FIG. 6 shows the relationship in voltage in the vicinity of the select transistor S2 at the time of "1" data write, and FIG. 7 shows the relationship in voltage in the vicinity of the select transistor S1 at the time of "1" data write.

As shown in FIG. 6, in the vicinity of the select transistor S2, a voltage of about 2V is applied to one end of the current path that is connected to the bit line BL0, and a voltage of about 5V is applied to the other end of the current path that is connected to the current path of the memory cell transistor M0. Thus, a voltage of about 2V is applied to the select gate line SSL of the select transistor S2, and the transfer of voltage between the bit line BL0 and the memory string 1 is cut off.

As shown in FIG. 7, in the vicinity of the select transistor S1, a voltage of about 1V is applied to one end of the current path of the select transistor S2 that is connected to the common source line SL, and a voltage of about 5V is applied to the other end of the current path of the select transistor S2, which is connected to one end of the current path of the memory cell transistor M15. A voltage of about 0V is applied to the select gate line GSL. Thus, the transfer of voltage between the common source line SL and the memory string 1 is cut off.

2-3. "0" Data Write Operation

Figure 8:
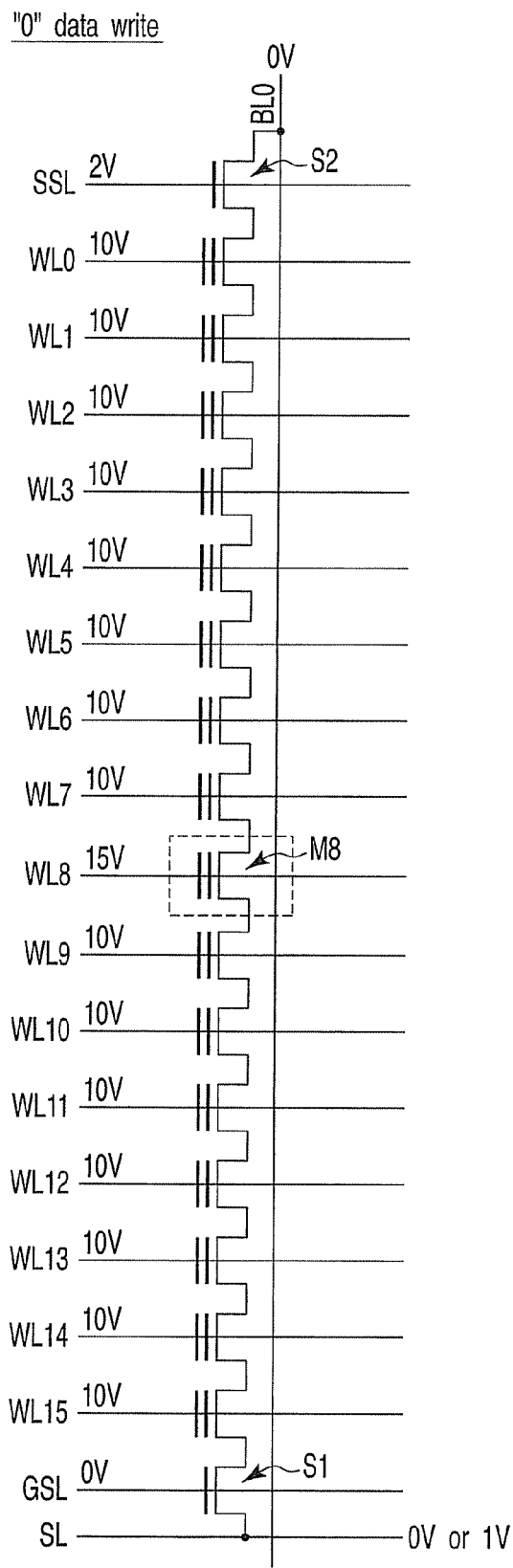
FIG. 8 is a circuit diagram for explaining "0" data write in the semiconductor memory device according to the first embodiment.

Next, the "0" data write operation is described with reference to FIG. 8 to FIG. 10. In this description, it is assumed, for example, that "0" data is written in the memory cell transistor M8. The "0" data write operation is, in other words, an operation in which electrons are injected in the floating electrode 7 of the memory cell transistor M8.

As shown in the Figures, the "0" data write operation differs from the "1" data write operation in that the voltage applied to the bit line BL is kept at 0V.

Thereby, even if the potential of the selected word line WL8 and the non-selected word lines WL0 to WL7 and WL9 to WL15 is raised, the potential in the channel region does not vary. Accordingly, the potential difference between the selected word line WL8 and the channel exceeds the write threshold of the memory cell transistor M8, and electrons are injected in the floating electrode 7 through the tunnel insulation film 6 by FN tunneling, thus writing "0" data.

The difference between the "1" write operation and the "0" write operation is whether the channel potential at the time of boost of the word lines WL0 to WL15 is 0V or a higher voltage, e.g. about 5V. Making use of this difference, the "1" write and "0" write are controlled.

In order to improve the cut-off characteristics of the select transistor S1, the potential of the common source line may be raised by, e.g. 1V, at the time of data write.

Figure 9:
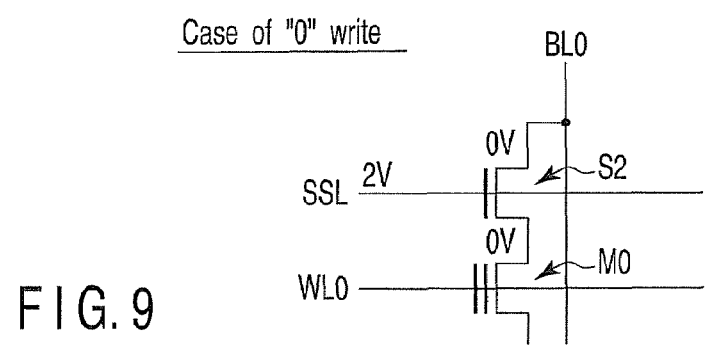
FIG. 9 is a circuit diagram showing the vicinity of the select transistor S1 at the time of "0" data write in FIG. 8.
Figure 10:
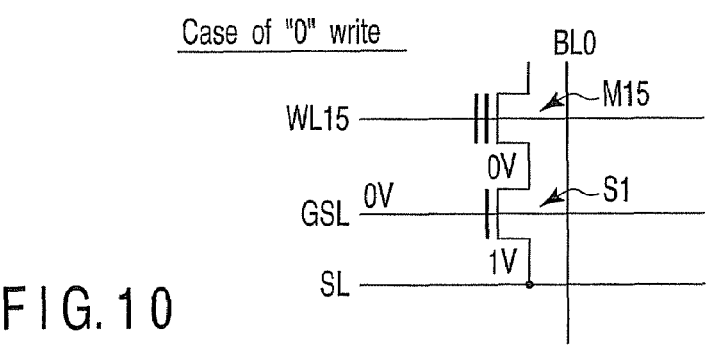
FIG. 10 is a circuit diagram showing the vicinity of the select transistor S2 at the time of "0" data write in FIG. 8.

FIG. 9 shows the relationship in voltage in the vicinity of the select transistor S2 at the time of "0", and FIG. 10 shows the relationship in voltage in the vicinity of the select transistor S1 at the time of "0".

As shown in FIG. 9, a voltage of about 0V is applied to one end of the current path of the select transistor S2, which is connected to the bit line BL0, and a voltage of about 2V is applied to the select gate line SSL. Thus, 0V of the bit line BL0 is transferred to the memory string 1.

As shown in FIG. 10, a voltage of about 1V is applied to one end of the current path of the select transistor S1, which is connected to the common source line SL, a voltage of about 0V is applied to the other end of the current path of the select transistor S2, which is connected to the current path of the memory cell transistor M15, and 0V is applied to the select gate line GSL. Thereby, the transfer of voltage between the common source line SL and the memory string 1 is cut off.

As described above, if the cut-off characteristics of the select transistors S1 and S2 are poor at the time of the "1" or "0" write operation, the potential of the channel region of the memory string 1 varies. Consequently, the predetermined write operation cannot be executed.

2-4. Relationship Between Channel Length L and Threshold Voltage Vt

Next, referring to FIG. 11, a description is given of the relationship between the channel length and the threshold voltage Vt of the select transistor S1, S2.

In the case where the gate length of the memory cell transistor, M0 to M15, is, e.g. about 90 nm, it is desirable that the channel length of the select transistor S1, S2 be set at about 150 nm to 250 nm or more, in order to obtain sufficient cut-off characteristics. The reason for this is that in the case where the channel length L is less than a channel length L1 (about 150 nm to 250 nm), as shown in FIG. 11, the threshold voltage Vt of the select transistor S1, S2 sharply decreases.

In addition, a variation $\Delta Vt1$ of the threshold voltage, which corresponds to a channel length $\Delta L0$ varying from the channel length L1 by, e.g. ±50 nm, is small.

On the other hand, a variation $\Delta Vt2$ of the threshold voltage, which corresponds to a channel length $\Delta L0$ varying from a channel length L2 (about 50 nm) that is less than the channel length L1 by, e.g. ±50 nm, is greater than the variation $\Delta Vt1$.

Therefore, the advantageous effect of improvement of the cut-off characteristics by the increase in channel length is greater in the case of a small channel length, e.g. less than about 150 nm to 250 nm.

As described above, even in the case where the channel length is small, e.g. about 50 nm, the effective channel length of the select transistor S1, S2 according to the present embodiment can be increased by virtue of the provision of the recess structure 15 (the recess structure oblique surface 15-1 and recess structure bottom surface 15-2). As a result, the cut-off characteristics can be enhanced, the area of occupation by the select transistor S1, S2 can be reduced, and microfabrication can advantageously be achieved.

For example, compared to a planar channel length without the recess structure 15 of this embodiment, the channel length, which is increased by the recess structure 15, is as described below.

Comparison is made, for example, with the case of a planar channel length of about 50 nm. In the case where the angle $\theta s$ of the recess structure 15 is about 45° (the case in which the increase in channel length is considered to be minimum), the effective channel length can be increased by about 1.28 times, compared to the planar channel length (about 50 nm).

Further, comparison is made, for example, with the case of a planar channel length of about 150 nm. In the case where the angle $\theta s$ of the recess structure 15 is about 85°, the effective channel length can be increased by about 3.5 times, compared to the planar channel length (about 150 nm).

Comparison is made, for example, with the case of a planar channel length of about 50 nm. In the case where the angle $\theta s$ of the recess structure 15 is about 85° (the case in which the increase in channel length is considered to be maximum), the effective channel length can be increased by about 8 times, compared to the planar channel length (about 50 nm).

<3. Manufacturing Method>

Next, a manufacturing method of the semiconductor memory device according to the present embodiment is described with reference to FIG. 12 to FIG. 22, taking the semiconductor memory device shown in FIG. 1 to FIG. 4 as an example.

To start with, N-type impurities are doped in a P-type silicon substrate (Si-sub) 3 by, e.g. ion implantation. Thus, an N-type well (n-well) 4 is formed.

Then, P-type impurities of, e.g. boron are doped in the N-type well 4 by, e.g. ion implantation at a concentration of about $10^{14}$ cm$^{-3}$ to $10^{19}$ cm$^{-3}$. Thus, a P-type well (p-well) 5 is formed.

Figure 12:
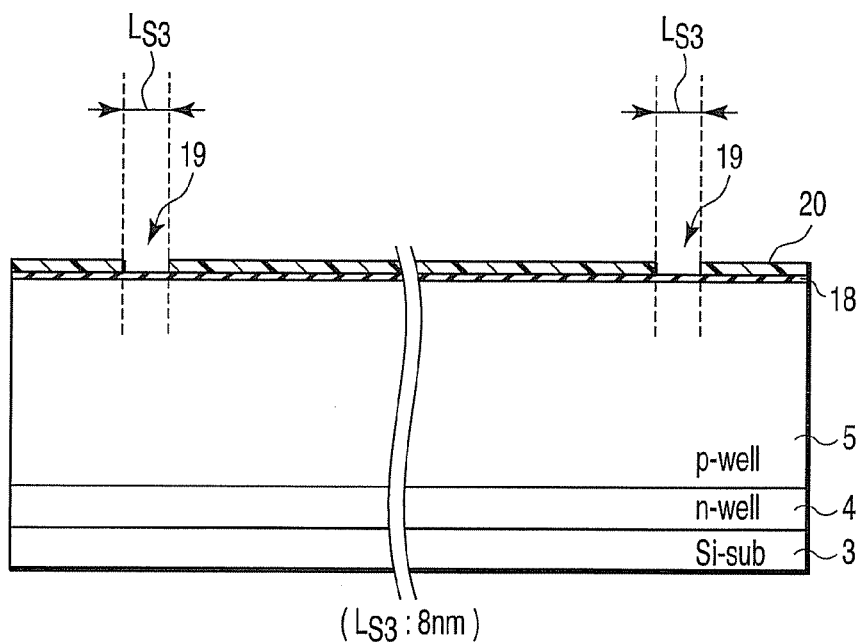
FIG. 12 is a cross-sectional view illustrating a fabrication step of the semiconductor memory device according to the first embodiment.

Thereafter, as shown in FIG. 12, a sacrificial oxide film 18 is formed on the P-type well 5 by, e.g. thermal oxidation. The sacrificial oxide film 18 functions to reduce stress occurring due to direct contact between a photoresist 20, which is coated later, and the substrate 5. In a subsequent step, a silicon nitride film may be formed as a hard mask on the sacrificial oxide film 18, and further an anti-reflection film may be formed thereon. In this case, the stress occurring due to direct contact between the photoresist 20 and the substrate 5 can more effectively be reduced.

Subsequently, the photoresist 20 is coated on the sacrificial oxide film 18.

Then, the photoresist 20 is exposed and developed by, e.g. lithography, and openings 19 are formed by using such a resist pattern that only central portions of areas, where the select transistors S1 and S2 are to be formed, are opened. In this manner, the resist pattern 19 having openings 19 are formed so as to selectively open the parts corresponding to the recess gate structures of the select transistors S1 and S2.

Preferably, the size Ls3 of each opening 19 in the lithography step should be set at, e.g. about 8 nm or more. The reason for this is that the length Ls2 of the recess structure bottom surface 15-2, which is formed in a later step, is so formed as to fall within a predetermined range (6 nm $\leq$ Ls2 $\leq$ 10 µm).

It is effective to add, prior to the lithography step, an ion implantation step, etc., for forming wells of memory cell transistors and transistors of peripheral circuits, and controlling threshold values.

Subsequently, as shown in FIG. 13, using the photoresist 20 as an etching mask, dry etching, such as RIE (Reactive Ion Etching), is performed through the sacrificial oxide film 18 to a depth of approximately Hs from the surface of the substrate 5, thus forming a recess structure 15. By this etching step, the recess structure 15, which includes a recess oblique surface 15-1 and a recess bottom surface 15-2 and is provided only at a central portion of the select transistor S1, S2, is formed in the substrate 5.

In this etching step, it is preferable to control the application voltage in the RIE, so that the depth Hs from the surface of the substrate 5 may become, e.g. about 5 nm to 200 nm.

In addition, in this etching step, it is preferable to control the angle in the RIE, so that the angle θs between the surface of the substrate (P-type well) 5 and recess oblique surface 15-2 may fall in a range of, e.g. between about 45° and 85°.

Moreover, in this etching step, it is preferable to control the application voltage, etc. so that the angle between the recess bottom surface 15-2 and the surface of the substrate (P-type well) 5 may fall in a range of, e.g. between about −3° and 3°. For example, in the case where the etching is carried out by the RIE (reactive ion etching) method, it is effective to control the application voltage to be applied to the cathode where the sample to be processed is placed. It is more preferable to control the application voltage, etc. so that the recess bottom surface 15-2 may become substantially parallel to the surface of the substrate (P-type well) 5.

In the meantime, in this step, the sacrificial oxide film 18 and semiconductor substrate 5 may be dry-etched batchwise, thereby to form the recess structure 15.

Subsequently, as shown in FIG. 14, a diffusion layer 21 may be formed by carrying out ion implantation for controlling threshold values of the select transistors S1 and S2, using the photoresist 20 as an ion-implantation mask. This is advantageous in that the threshold values of the memory cell transistors M0 to M15 and the select transistors S1 and S2 may independently be controlled by the diffusion layers 21. Besides, in the ion implantation step, it is more effective to perform ion implantation twice by setting the angle of ion implantation at 3° or more, so that ion implantation can uniformly be performed on the recess side surface 15-1 and recess bottom surface 15-2.

Figure 15:
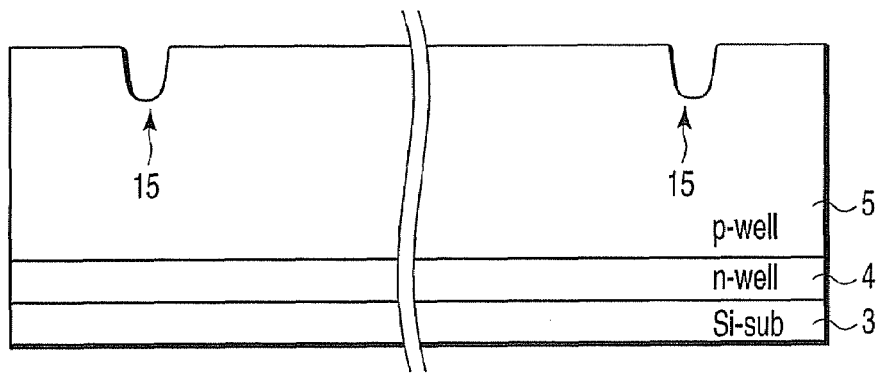
FIG. 15 is a cross-sectional view illustrating a fabrication step of the semiconductor memory device according to the first embodiment.

Subsequently, as shown in FIG. 15, the photoresist 20 is removed by, e.g. an asher step, and thereafter the sacrificial oxide film 18 is removed by using, e.g. chemical etching.

It is possible to add, between the step of removing the photoresist 20 and the step of removing the sacrificial oxide film 18, an ion implantation step for forming wells of memory cell transistors M0 to M15 and transistors of peripheral circuits and controlling threshold values, and an anneal step for activating the implanted impurity ions.

Figure 16:
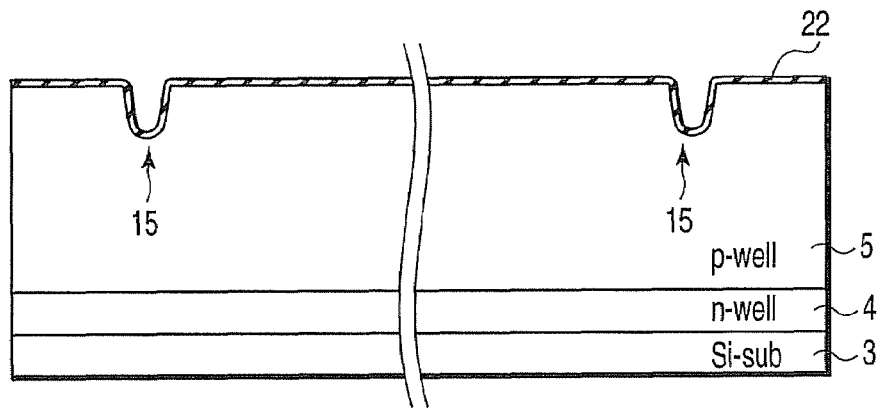
FIG. 16 is a cross-sectional view illustrating a fabrication step of the semiconductor memory device according to the first embodiment.

Subsequently, as shown in FIG. 16, a silicon oxide film or an oxynitride film is formed by, e.g. thermal oxidation. Thus, an insulation film 22 is formed. In a case where the thickness of the insulation film 22 varies in some transistors, it is possible to add, before or after the present step, a step of forming a thick or thin insulation film for such transistors.

Figure 17:
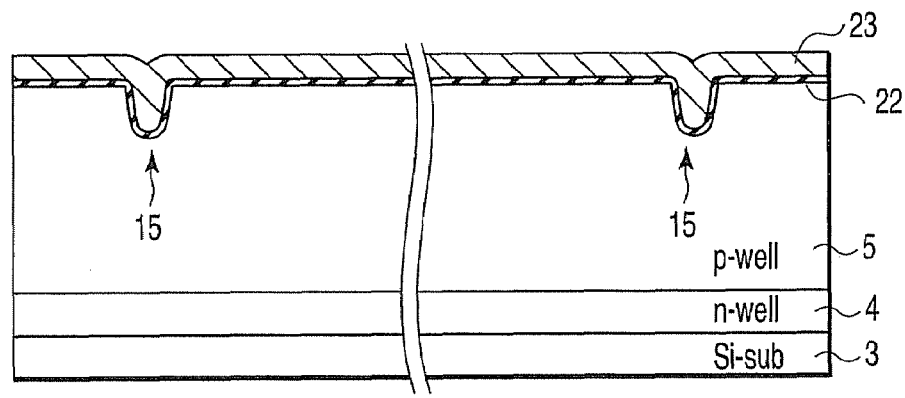
FIG. 17 is a cross-sectional view illustrating a fabrication step of the semiconductor memory device according to the first embodiment.
Figure 18D:
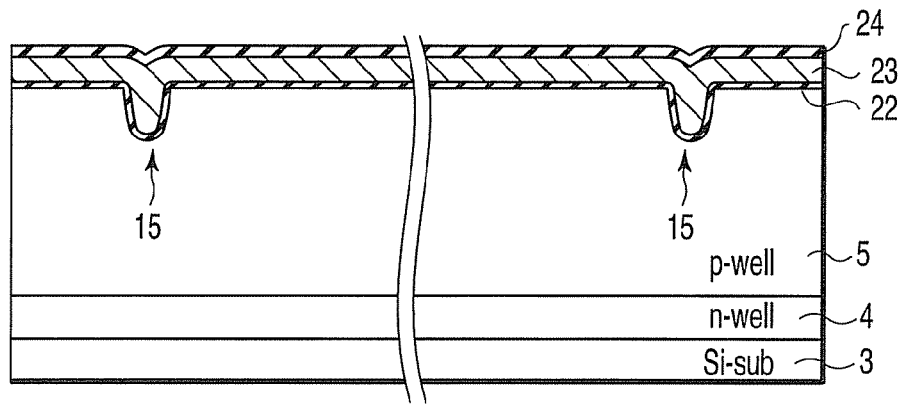
FIG. 18D is a cross-sectional view taken along line D-D in FIG. 2.
Figure 19A:
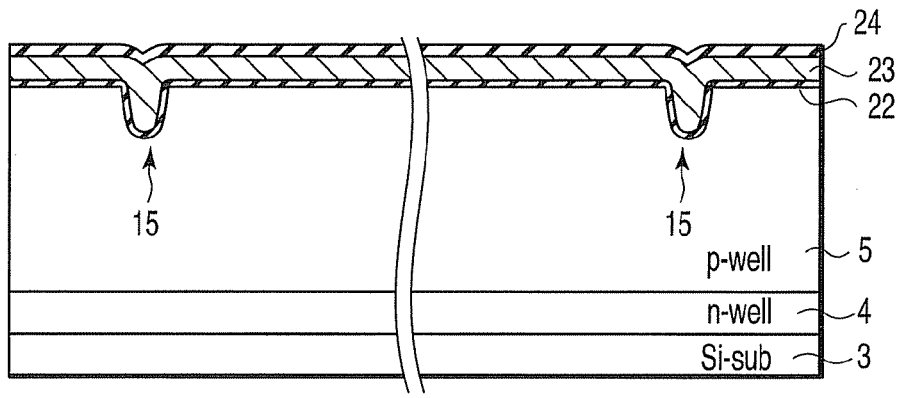
FIG. 19A is a cross-sectional view, taken along line A-A in FIG. 2, illustrating a fabrication step of the semiconductor memory device according to the first embodiment.
Figure 19B:
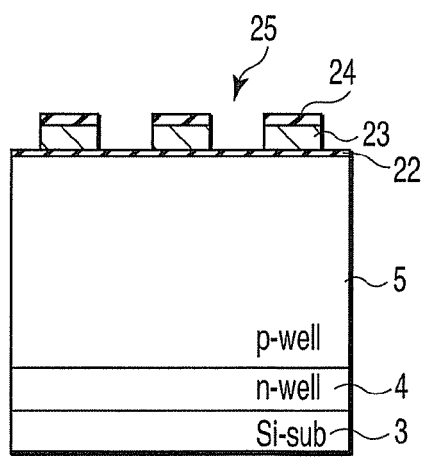
FIG. 19B is a cross-sectional view taken along line B-B in FIG. 2.
Figure 19C:
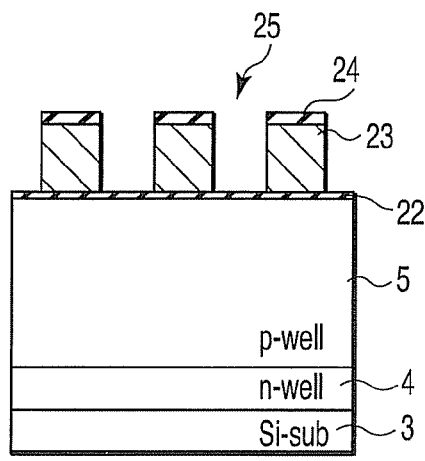
FIG. 19C is a cross-sectional view taken along line C-C in FIG. 2.
Figure 19D:
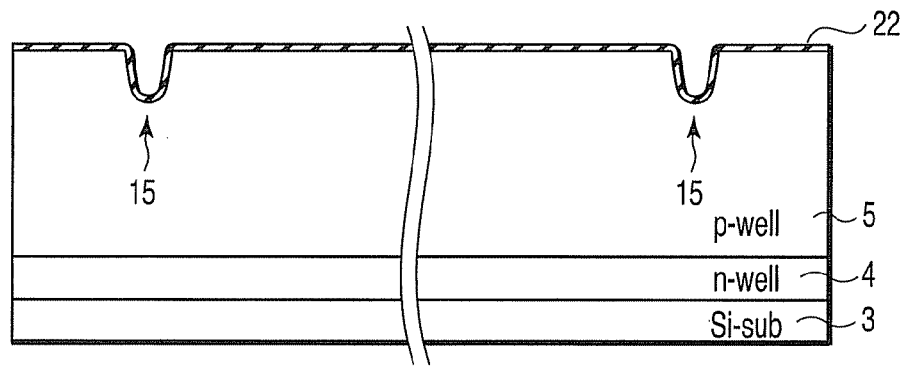
FIG. 19D is a cross-sectional view taken along line D-D in FIG. 2.
Figure 20A:
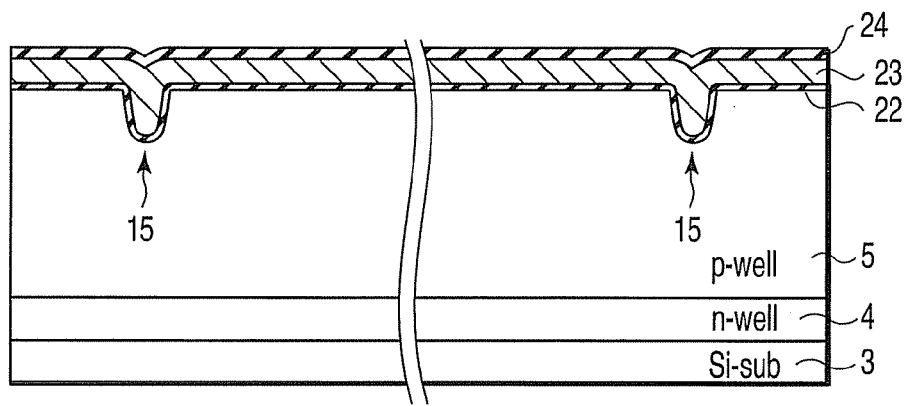
FIG. 20A is a cross-sectional view, taken along line A-A in FIG. 2, illustrating a fabrication step of the semiconductor memory device according to the first embodiment.
Figure 20B:
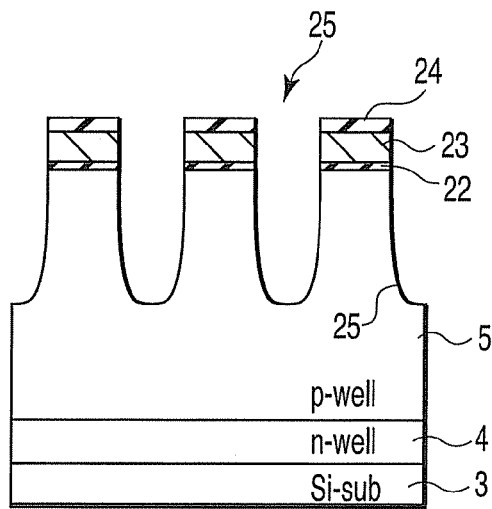
FIG. 20B is a cross-sectional view taken along line B-B in FIG. 2.
Figure 20C:
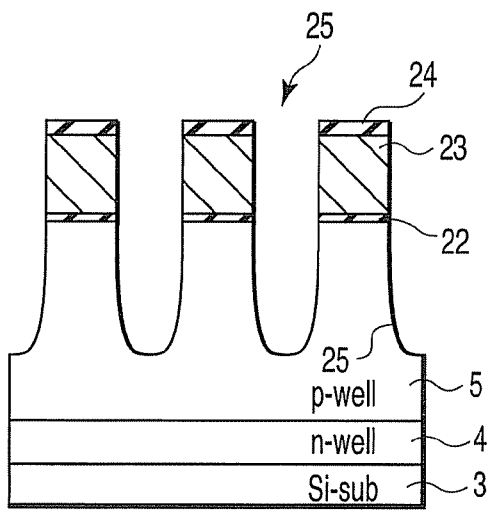
FIG. 20C is a cross-sectional view taken along line C-C in FIG. 2.
Figure 20D:
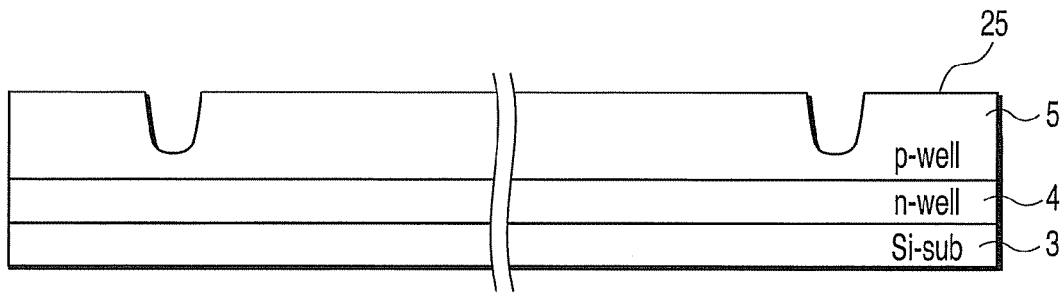
FIG. 20D is a cross-sectional view taken along line D-D in FIG. 2.
Figure 21A:
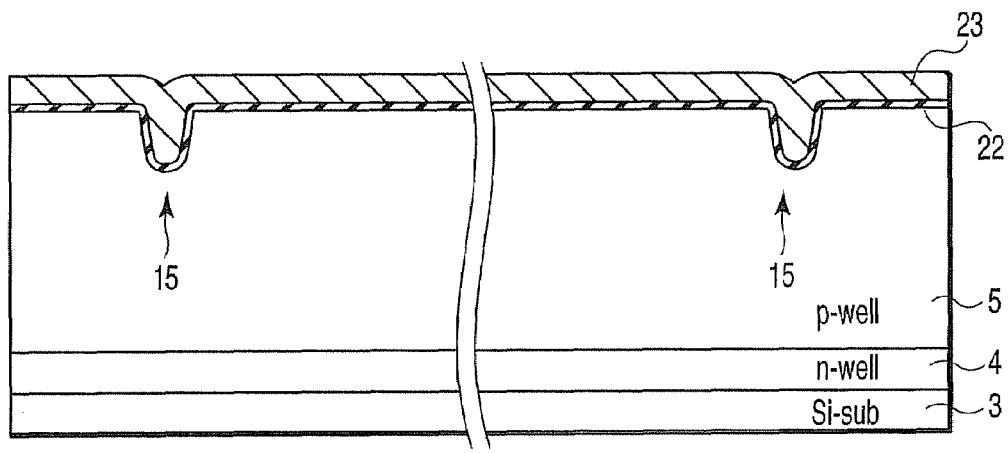
FIG. 21A is a cross-sectional view, taken along line A-A in FIG. 2, illustrating a fabrication step of the semiconductor memory device according to the first embodiment.
Figure 21B:
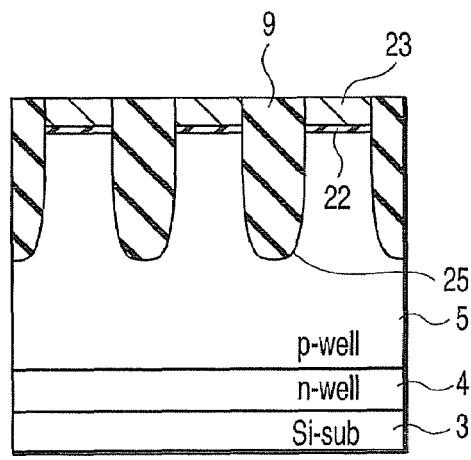
FIG. 21B is a cross-sectional view taken along line B-B in FIG. 2.
Figure 21C:
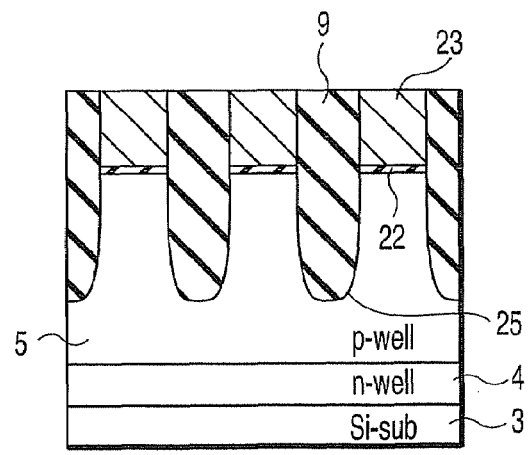
FIG. 21C is a cross-sectional view taken along line C-C in FIG. 2.
Figure 21D:
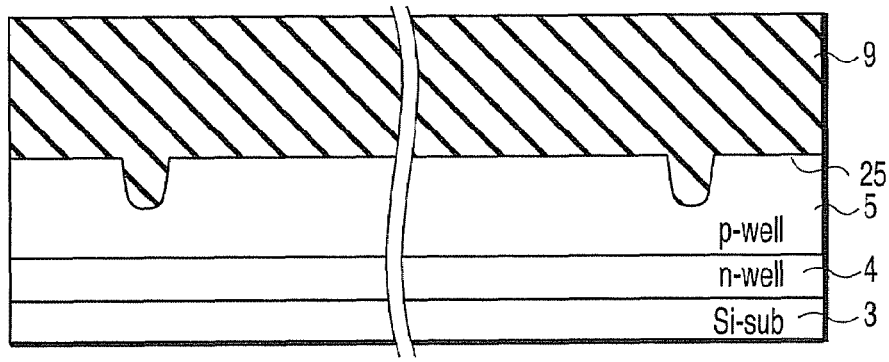
FIG. 21D is a cross-sectional view taken along line D-D in FIG. 2.
Figure 22A:
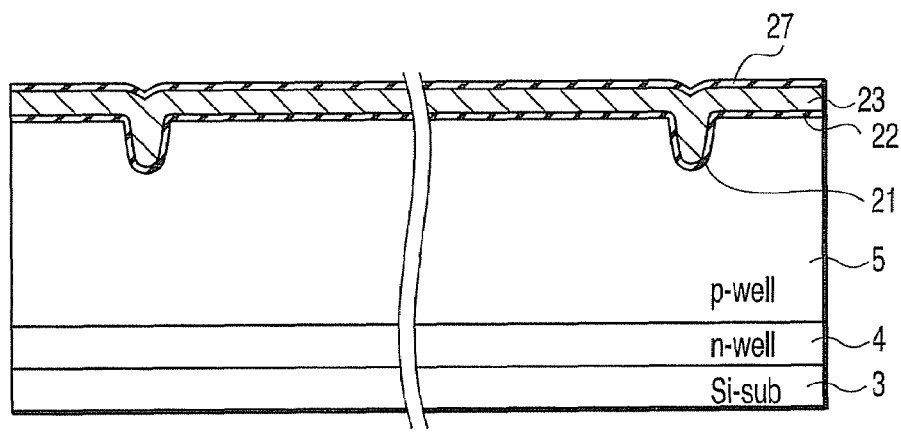
FIG. 22A is a cross-sectional view, taken along line A-A in FIG. 2, illustrating a fabrication step of the semiconductor memory device according to the first embodiment.
Figure 22B:
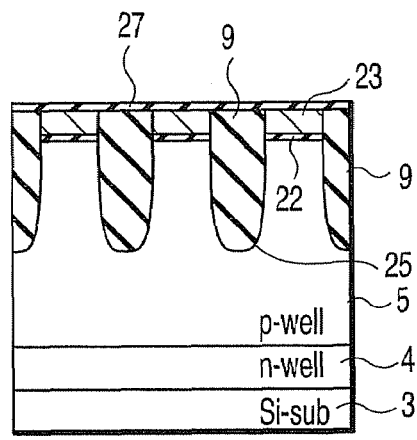
FIG. 22B is a cross-sectional view taken along line B-B in FIG. 2.
Figure 22C:
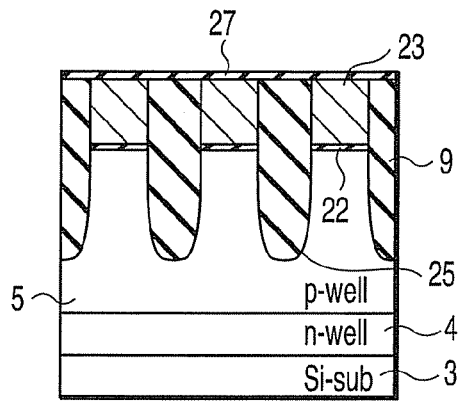
FIG. 22C is a cross-sectional view taken along line C-C in FIG. 2.
Figure 22D:
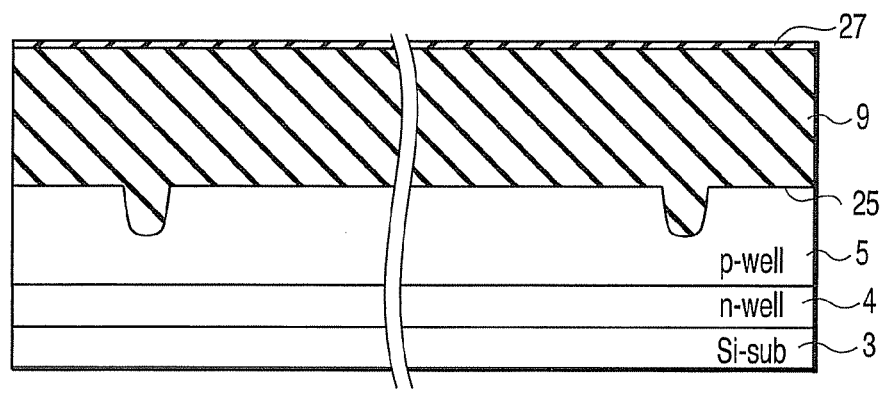
FIG. 22D is a cross-sectional view taken along line D-D in FIG. 2.

Subsequently, as shown in FIG. 17, a polysilicon layer 23 is formed on the insulation film 22 by, e.g. CVD (Chemical Vapor Deposition). This polysilicon layer 23 becomes an underlayer of the floating electrode 7 or the gate electrode 12 in a later fabrication step.

In the case where the planarity of the polysilicon layer 23 above the recess structure 15 is not adequate, the polysilicon is deposited to a greater thickness, and CMP (Chemical Mechanical Polishing), for instance, may be performed. By this step, the polysilicon layer 23 may advantageously be formed so as to have target thickness and planarity.

Subsequently, as shown in FIG. 18A to FIG. 18D, a silicon nitride film 24 for a hard mask is formed on the polysilicon layer 23 by, e.g. CVD. The characters "A" to "D" added to the numbers of Figures indicate cross sections taken along line A-A, line B-B, line C-C and line D-D in FIG. 2, respectively.

Subsequently, a photoresist 20 is coated on the silicon nitride film 24, and the photoresist 20 is exposed and developed by lithography, thereby forming a resist pattern having openings 25, from which the silicon nitride film 24 at areas corresponding to device isolation regions is exposed. An anti-reflection film may further be deposited on the silicon nitride film 24, so as to form a micro-resist pattern.

Subsequently, as shown in FIG. 19A to FIG. 19D, using the photoresist 20 as a mask, anisotropic etching, such as RIE, is performed to etch the silicon nitride film 24 for the hard mask at areas corresponding to the device isolation regions.

After the photoresist is removed by an asher step, anisotropic etching, such as RIE, is performed by using the silicon nitride film 24 as an etching mask, and the polysilicon layer 23 is etched down to the surface of the insulation film 22.

In this dry etching step, an etching method with a high etching selectivity ratio between the polysilicon layer 23 and the silicon nitride film 24 may be used, and over-etching may further be performed from a time that is detected with respect to the silicon nitride film in the region other than the recess structure 15. Thereby, a thick portion of the polysilicon layer 23 in the recess gate trench may be removed.

In the case where an anti-reflection film is formed on the silicon nitride film 24, the resist pattern 20 is removed after the anti-reflection film is dry-etched, and the silicon nitride film 24 is dry-etched by using the etched anti-reflection film as an etching mask.

Subsequently, as shown in FIG. 20A to FIG. 20D, a silicon nitride film 24 is used once again as a hard mask, and anisotropic etching, such as RIE, is performed, thereby forming a trench for a device isolation region, which penetrates the oxide film 22 and reaches a predetermined depth in the silicon substrate 5.

In this step, when the recess gate trench part is etched, there may be a case in which a trench is further formed in the device isolation region 25.

Subsequently, as shown in FIG. 21A to FIG. 21D, a silicon oxide film, for instance, is formed by, e.g. CVD in the trench for the device isolation region. Thereafter, the silicon oxide film is buried up to the surface of the polysilicon layer 23 and planarized by CMP. Thus, a device isolation region 9 is formed.

In this step, it is not necessary to set the thickness of the device isolation insulation film 9 to be equal to the depth of the trench for the device isolation region, and it is not necessary to set the height of the device isolation insulation film to be equal to the height of the polysilicon layer 23. In the case where the height of the polysilicon layer 23 is set to be equal to the height of the device isolation insulation film 9, it is effective to make use of CMP by using, as a stopper, the silicon nitride film which is used as the hard mask.

On the other hand, in the case where the height of the polysilicon layer 23 is set to be different from the height of the device isolation insulation film 9, an inter-gate insulation film 27, which is formed later, becomes non-planar. Thus, this is advantageous in that the capacitance between the control electrode and floating electrode of the memory cell transistor M can be enhanced.

Subsequently, the silicon nitride film 24 on the polysilicon layer 23 is removed by using, e.g. a chemical etching method.

Subsequently, as shown in FIG. 22A to FIG. 22D, a silicon oxide film or an oxynitride film is deposited on the polysilicon layer 23 by, e.g. CVD, and an inter-gate insulation film 27 is formed. Examples of other materials of the inter-gate insulation film 27 are an ONO film comprising a silicon oxide film—silicon nitride film—silicon oxide film, an NONON film in which an ONO structure is interposed between silicon nitride films, and a film including a high-dielectric-constant material, such as an $Al_2O_3$ film, an HfAlO film or an $HfSiO_x$ film.

Subsequently, openings are selectively formed in the inter-gate insulation film 27 at areas corresponding to central portions of the select transistors S1 and S2. Thus, an inter-gate insulation film 10 is formed.

In this fabrication step, a mask similar to the mask, which has been used in forming the recess structure 15 (FIG. 13), may be used. Thereby, misalignment can be prevented and the manufacturing cost can be reduced.

Subsequently, a polysilicon layer, which becomes the control electrode 11, is deposited on the inter-gate insulation film 27. Using lithography, the polysilicon layer, inter-gate insulation layer 27, polysilicon layer 23 and insulation film 22 are separated down to the surface of the substrate 5 in the word line direction. Thereby, the stacked-layer structures, which are separated to form the memory cell transistors M and select transistors S1 and S2, are formed.

Subsequently, using well-known fabrication steps, spacers 14 are formed along side walls of the stacked-layer structures.

Subsequently, using the stacked-layer structures as a mask, impurities are doped in the substrate 5 by, e.g. ion implantation, and sources D and drains D are formed. Thus, the memory cell transistors M0 to M15 and select transistors S1 and S2 are formed.

Thereafter, using well-known fabrication steps, interlayer insulation films 17-1 and 17-2, bit line contacts BC-1 to BC-3, source line contacts SC-1 and SC-2 and bit lines BL0 to BL2 are formed. Thus, the semiconductor memory device as shown in FIG. 1 to FIG. 4 is fabricated.

<4. Advantageous Effects of the Semiconductor Memory Device According to the First Embodiment and the Manufacturing Method Thereof>

With the semiconductor memory device and the manufacturing method thereof according to the present embodiment, at least the following advantageous effects (1) to (4) can be obtained.

(1) The cut-off characteristics can be improved and microfabrication can advantageously be achieved.

As described above, the select transistor S1, S2 according to the present embodiment has the recess gate structure which is provided on the semiconductor substrate 5 having the recess structure 15 that is lower, only at the central portion thereof, than the semiconductor substrate 5 on which the NAND memory string 1 is provided. The gate insulation film 13 is provided on the semiconductor substrate 5 including the recess structure 15, and the gate electrode 12 is provided on the gate insulation film 13.

Thus, the effective channel length of the select transistor S1, S2 can be increased, and the cut-off characteristics of the select transistor S1, S2 can be improved.

As a result, even at the time of the "1" or "0" data write as shown in FIG. 5 to FIG. 10, the variation in potential of the channel region of the memory string 1 can be prevented, and the predetermined "1" or "0" data write operation can be performed.

In order to obtain sufficient cut-off characteristics, it is desirable that the channel length of the select transistor S1, S2 be about 150 nm to 250 nm or more. This is demonstrated by the relationship between the channel length and the threshold voltage Vt of the select transistor S1, S2, as shown in FIG. 11.

As shown in FIG. 11, in the case where the channel length L is less than the channel length L1 (about 150 nm to 250 nm), the threshold voltage Vt of the select transistor S1, S2 sharply decreases. Thus, the variation $\Delta Vt1$ of the threshold voltage, which corresponds to the channel length $\Delta L0$ varying from the channel length L1 by, e.g. +50 nm, is small.

On the other hand, the variation $\Delta Vt2$ of the threshold voltage, which corresponds to the channel length $\Delta L0$ varying from the channel length L2 (about 50 nm) that is less than the channel length L1 by, e.g. ±50 nm, is much greater than the variation $\Delta Vt1$.

Therefore, the advantageous effect of improvement of the cut-off characteristics by the increase in channel length is greater in the case of the fine-structured select transistor having the channel length of, e.g. less than about 150 nm to 250 nm.

As described above, even in the case where the gate length of the memory cell transistor is, for example, 90 nm or less (e.g. about 60 nm, about 30 nm) and the channel length of the select transistor S1, S2 is small, e.g. about 50 nm, the select transistor S1, S2 of this embodiment has the recess structure (recess oblique surface 15-1, recess bottom surface 15-2). Therefore, the effective channel length can be increased, and the microfabrication of the select transistor S1, S2 can advantageously be achieved.

According to the structure of this embodiment, as described above, even with respect to the generation of devices with the gate length of, e.g. less than 50 nm, the cut-off characteristics can be improved, and the area of occupation by the select transistors within the memory cell array can be reduced. Therefore, microfabrication can advantageously be achieved.

For example, compared to the case in which the recess structure 15 is not provided, the effective channel length in the structure of this embodiment can be increased by about 1.28 times to about 8 times.

(2) The sufficient cut-off effect can be obtained.

The angle $\theta s$ of the oblique surface 15-1 of the recess structure according to the present embodiment is set in the range of between 45° and 85°.

The reason for this is that if the angle $\theta s$ is 85° or more (e.g. about 90°), the channel of the select transistor S1, S2 would be bent substantially at right angles, and concentration of the electric field occurs in the contact portion between the surface of the semiconductor substrate 5 and the oblique surface 15-1 of the recess structure. Thus, the cut-off effect would decrease.

On the other hand, if the angle $\theta s$ is 45° or less (e.g. about 30°), the recess structure 15 would become closer to a planar structure, the effective channel length would decrease, and the sufficient cut-off effect could not be obtained.

As described above, the angle $\theta s$ of the oblique surface 15-1 of the recess structure according to the present embodiment is advantageously set in the range (between 45° and 85°) in which the sufficient cut-off characteristics are obtained.

(3) Even in the case where misalignment occurs, the cut-off characteristics can be improved.

As described in the above section 1-2-1, the recess structure 15 is provided only at the central portion of the select transistor S1, S2.

Thus, even if misalignment occurs between the position of the recess structure 15 and the position of the gate electrode 12 at the time of the lithography step for forming the gate electrode 12, a variation in channel length can be suppressed and the cut-off characteristics can be improved.

The reason for this is that in the case where the recess structure 15 is provided on the entire semiconductor substrate 5 on which the select transistor S1, S2 is provided, if misalignment occurs between the position of the recess structure 15 and the position of the gate electrode 12, the channel length would greatly vary.

In the case where the length Ls2 of the bottom surface 15-2 of the recess structure is increased to the same length as the channel length of the select transistor S1, S2 and the recess structure 15 is provided on the entire semiconductor substrate 5 on which the select transistor S1, S2 is provided, it is considered that the effective channel length can be made greater. However, as described above, if misalignment occurs between the position of the recess structure 15 and the position of the select transistor S1, S2, such a case may occur that not only the variation in channel length increases but also the gate electrode 12 cannot be formed.

On the other hand, as shown in FIG. 11, even in the case where the recess structure 15 is provided only at the central part, the effective channel length can sufficiently be increased (e.g. about 1.28 times to 8 times) and the cut-off characteristics can be improved.

Furthermore, as described in the above section 1-2-3, it is desirable that the length Ls1 (the length between one end of the gate electrode 12 and the recess structure 15) in the channel direction of the semiconductor substrate surface, on which the select transistor S1, S2 is provided and from which the recess structure 15 is excluded, be 5 nm or more. However, it should suffice if only one of the lengths Ls1 of both side portions falls within the above range. It is not necessary that the lengths Ls1 of both side portions fall within the above range.

If the length Ls1 between one end of the gate electrode 12 and the recess structure 15 is set at 5 nm or more, the cut-off characteristics can be improved even if misalignment occurs as in the case of the above section 1-2-1.

Moreover, it is preferable that the length Ls2 in the channel direction of the bottom surface 15-2 of the recess structure be set at 6 nm or more.

If the length Ls2 of the bottom surface 15-2 of the recess structure falls within the above range, it is possible to prevent the recess portion from being completely depleted at the time of high voltage application.

(4) Occurrence of misalignment can be prevented and the manufacturing cost can be reduced.

As described in the above section 1-2-2, the recess structure 15 is provided in the substrate 5 at a position that is substantially immediately below the split part of the inter-gate insulation film (inter-poly insulation film) 10.

Thus, the recess structure 15 can surely be formed at a position (at a substantially central portion) away from the end of the gate electrode 12, and occurrence of misalignment between the position of the gate electrode 12 and the position of the recess structure 15 can be prevented.

Moreover, since the same mask can be used when the recess structure 15 is formed (in the step of FIG. 13) and the inter-gate insulation film (inter-poly insulation film) 10 is split, the manufacturing cost can be reduced.

Second Embodiment

Another Example of the Manufacturing Method (An Example in Which the Gate Insulation Film 13 is Formed Later)

Next, a manufacturing method of a semiconductor memory device according to a second embodiment of the invention is described with reference to FIG. 23 to FIG. 33. This embodiment relates to another example of the manufacturing method of the semiconductor memory device shown in FIG. 1 to FIG. 4. A detailed description of the parts common to those in the first embodiment is omitted here.

<Manufacturing Method>

Figure 23:
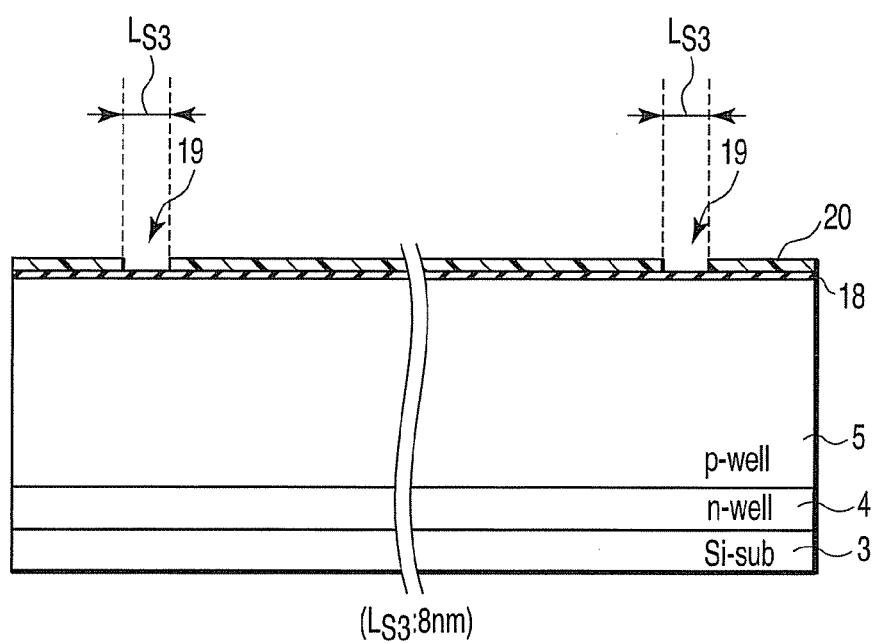
FIG. 23 is a cross-sectional view illustrating a fabrication step of a semiconductor memory device according to a second embodiment of the invention.

To start with, as shown in FIG. 23, a sacrificial oxide film 18 is formed on the P-type well 5 by, e.g. thermal oxidation. Subsequently, a photoresist 20 is coated on the sacrificial oxide film 18.

Then, the photoresist 20 is exposed and developed by, e.g. lithography, and openings 19 are formed by using such a resist pattern that only central portions of areas, where the select transistors S1 and S2 are to be formed, are opened.

Preferably, the size Ls3 of each opening 19 in the lithography step should be set at, e.g. about 8 nm or more. The reason for this is that the length Ls2 of the recess bottom surface 15-2, which is formed in a later fabrication step, is so formed as to fall within a predetermined range (6 nm$\leq$Ls2$\leq$10 μm).

Subsequently, as shown in FIG. 24, using the photoresist 20 as an etching mask, dry etching, such as RIE, is performed through the sacrificial oxide film 18 to a depth of approximately Hs from the surface of the substrate 5, thus forming a recess structure 15.

By this etching step, the recess structure 15, which includes a recess oblique surface 15-1 and a recess bottom surface 15-2 and is provided only at a central portion of the select transistor S1, S2, is formed in the substrate 5.

In this etching step, it is preferable to control the application voltage in the RIE as described above, so that the depth Hs from the surface of the substrate 5 may become, e.g. about 5 nm to 200 nm.

In addition, in this etching step, it is preferable to control the angle in the RIE, so that the angle θs between the surface of the substrate (P-type well) 5 and recess oblique surface 15-2 may fall in a range of, e.g. between about 45° and 85°.

Moreover, it is preferable to control the application voltage as described above, etc. so that the recess bottom surface 15-2 may become substantially parallel to the surface of the substrate (P-type well) 5.

Subsequently, as shown in FIG. 25, a diffusion layer 21 may be formed in the recess structure 15 by carrying out ion implantation for controlling threshold values of the select transistors S1 and S2, using the photoresist 20 as an ion-implantation mask. This is advantageous in that the threshold values of the memory cell transistors M0 to M15 and the select transistors S1 and S2 can independently be controlled by the diffusion layers 21.

Subsequently, as shown in FIG. 26, the photoresist 20 is removed by, e.g. an asher step, and thereafter the sacrificial oxide film 18 is removed by using, e.g. chemical etching.

Figure 27:
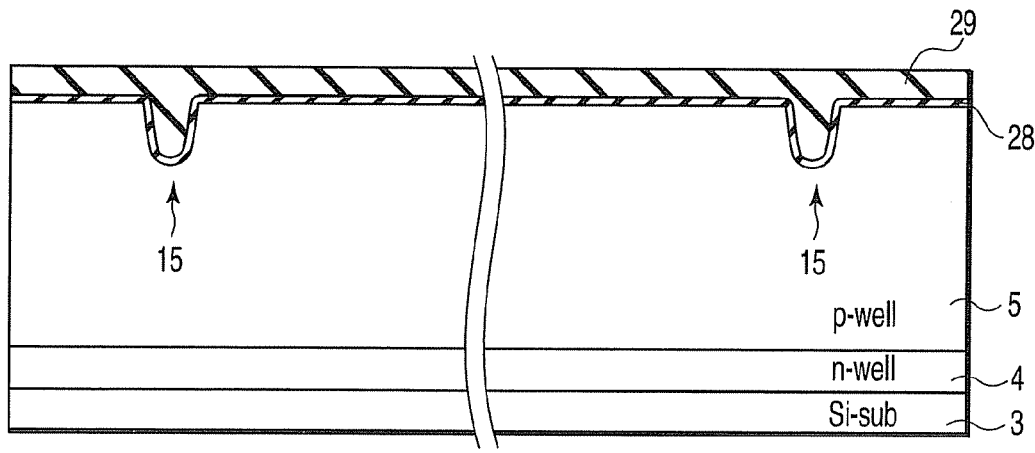
FIG. 27 is a cross-sectional view illustrating a fabrication step of the semiconductor memory device according to the second embodiment.
Figure 28A:
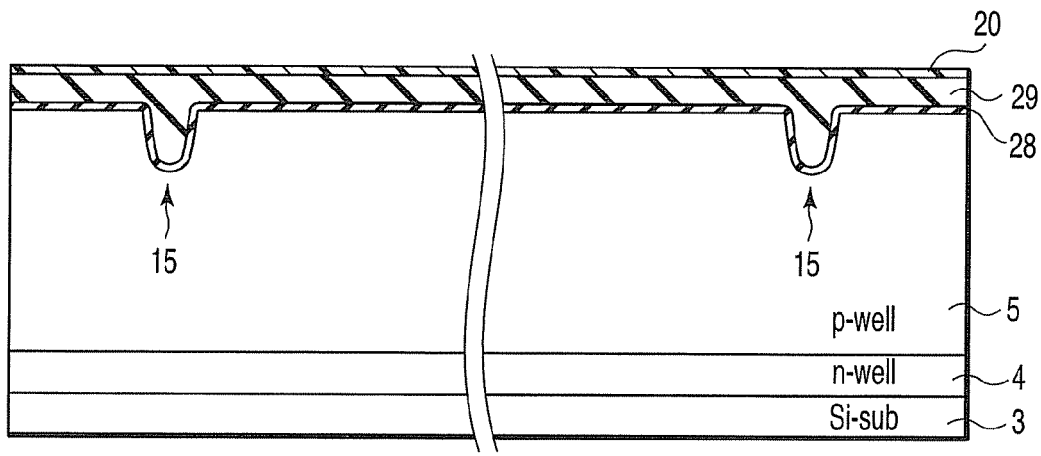
FIG. 28A is a cross-sectional view, taken along line A-A in FIG. 2, illustrating a fabrication step of the semiconductor memory device according to the second embodiment.
Figure 28B:
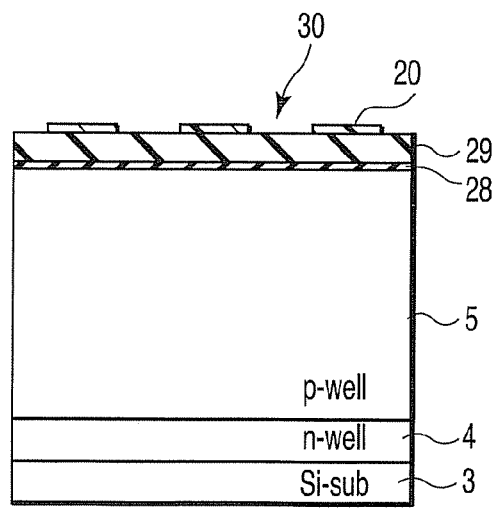
FIG. 28B is a cross-sectional view taken along line B-B in FIG. 2.
Figure 28C:
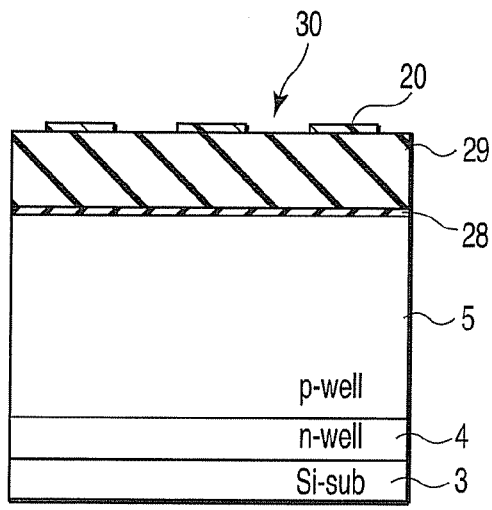
FIG. 28C is a cross-sectional view taken along line C-C in FIG. 2.
Figure 28D:
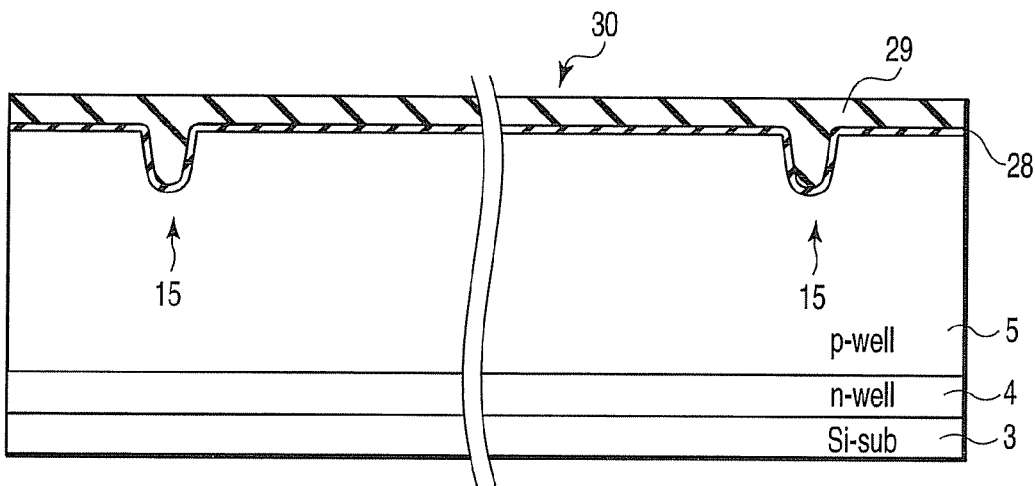
FIG. 28D is a cross-sectional view taken along line D-D in FIG. 2.
Figure 29A:
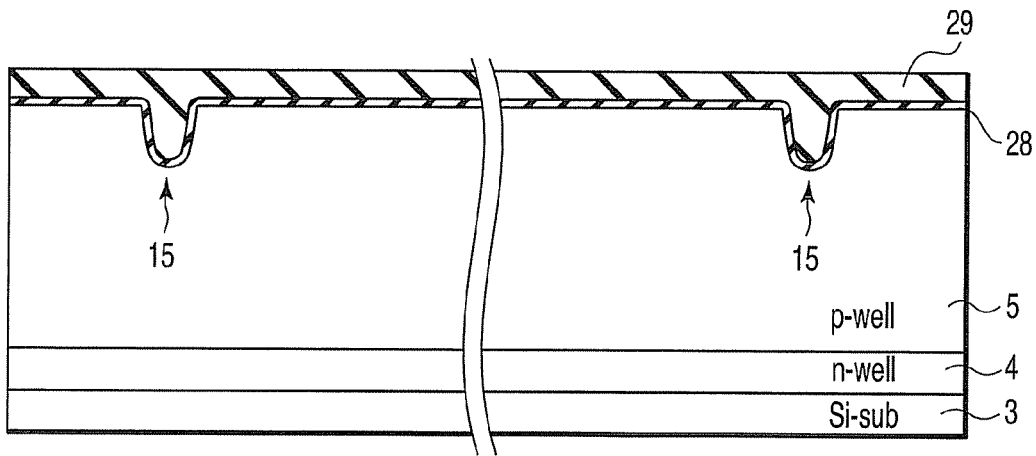
FIG. 29A is a cross-sectional view, taken along line A-A in FIG. 2, illustrating a fabrication step of the semiconductor memory device according to the second embodiment.
Figure 29B:
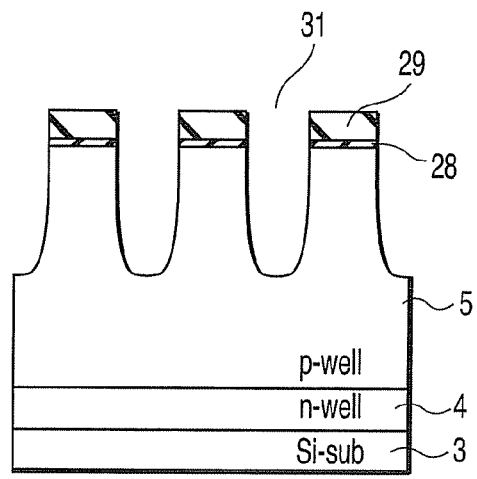
FIG. 29B is a cross-sectional view taken along line B-B in FIG. 2.
Figure 29C:
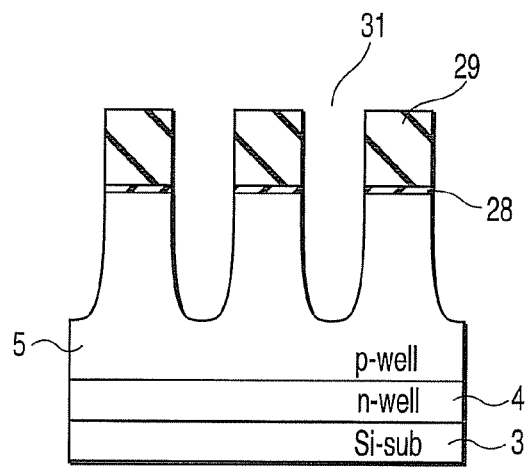
FIG. 29C is a cross-sectional view taken along line C-C in FIG. 2.
Figure 29D:
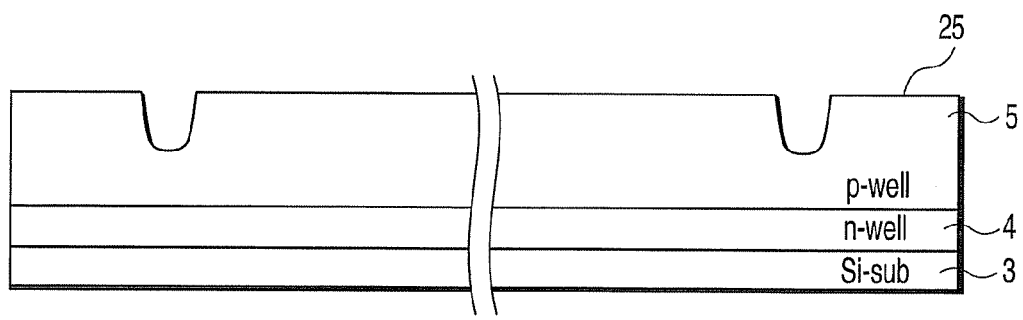
FIG. 29D is a cross-sectional view taken along line D-D in FIG. 2.
Figure 30A:
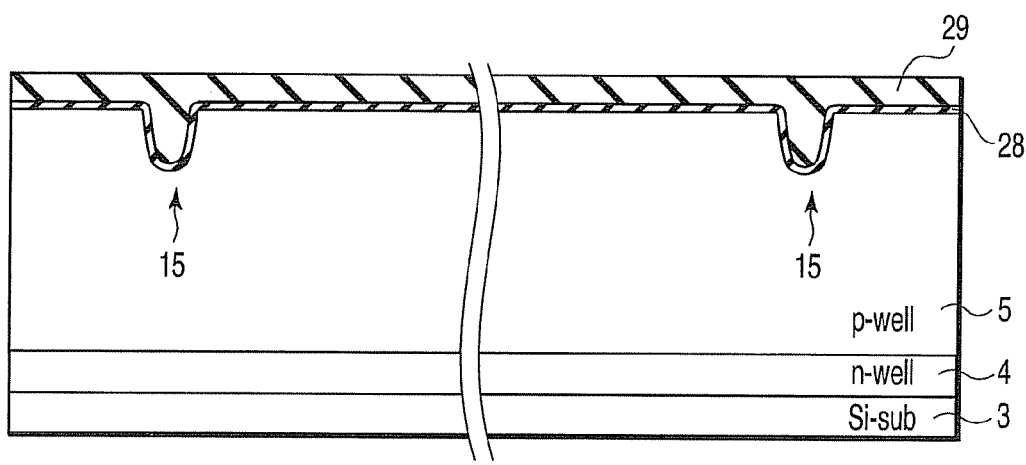
FIG. 30A is a cross-sectional view, taken along line A-A in FIG. 2, illustrating a fabrication step of the semiconductor memory device according to the second embodiment.
Figure 30B:
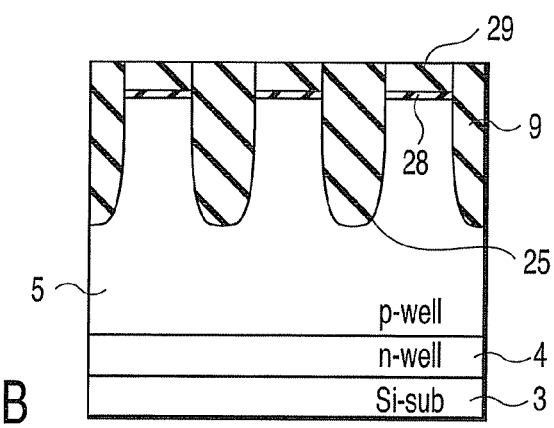
FIG. 30B is a cross-sectional view taken along line B-B in FIG. 2.
Figure 30C:
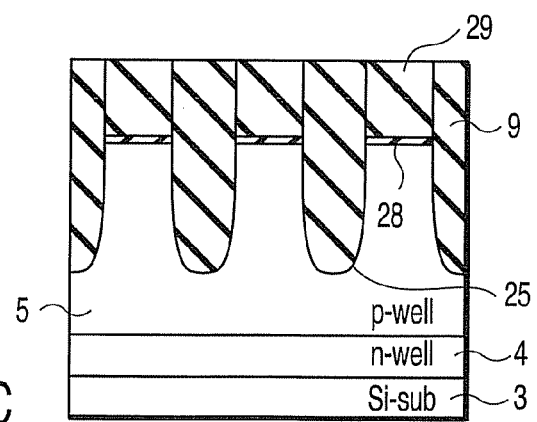
FIG. 30C is a cross-sectional view taken along line C-C in FIG. 2.
Figure 31C:
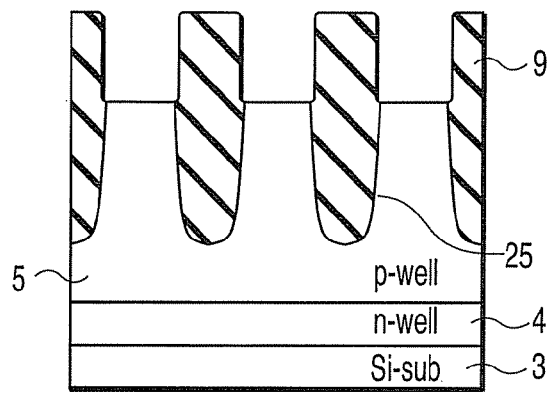
FIG. 31C is a cross-sectional view taken along line C-C in FIG. 2.
Figure 31D:
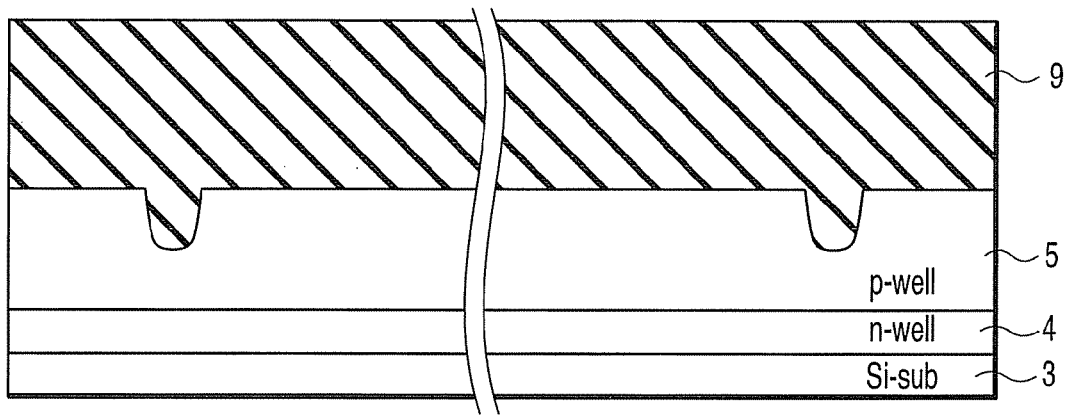
FIG. 31D is a cross-sectional view taken along line D-D in FIG. 2.
Figure 32A:
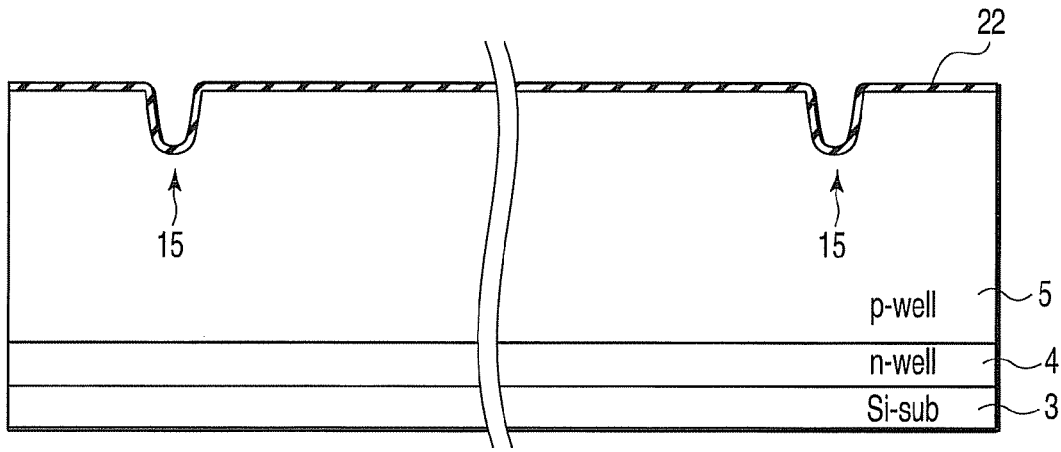
FIG. 32A is a cross-sectional view, taken along line A-A in FIG. 2, illustrating a fabrication step of the semiconductor memory device according to the second embodiment.
Figure 32B:
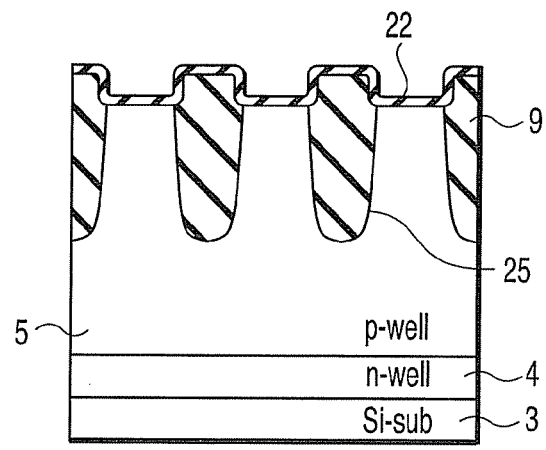
FIG. 32B is a cross-sectional view taken along line B-B in FIG. 2.
Figure 32C:
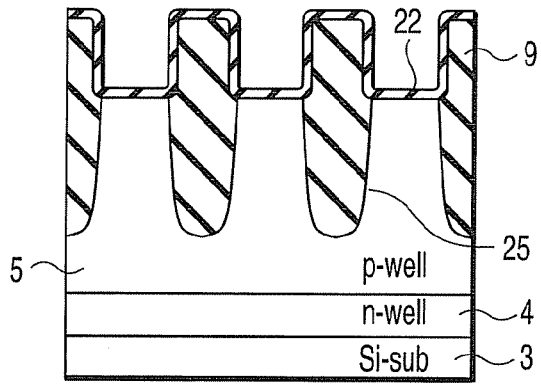
FIG. 32C is a cross-sectional view taken along line C-C in FIG. 2.
Figure 32D:
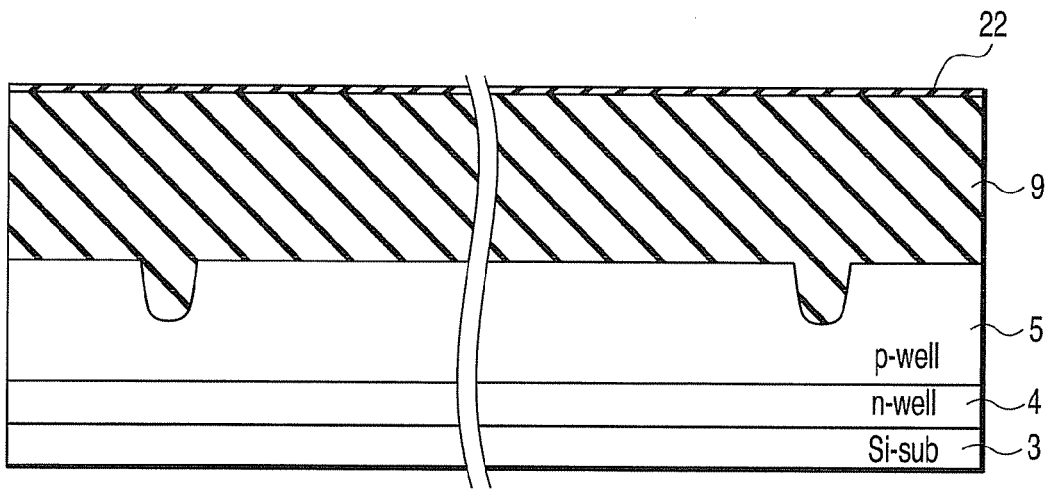
FIG. 32D is a cross-sectional view taken along line D-D in FIG. 2.
Figure 33A:
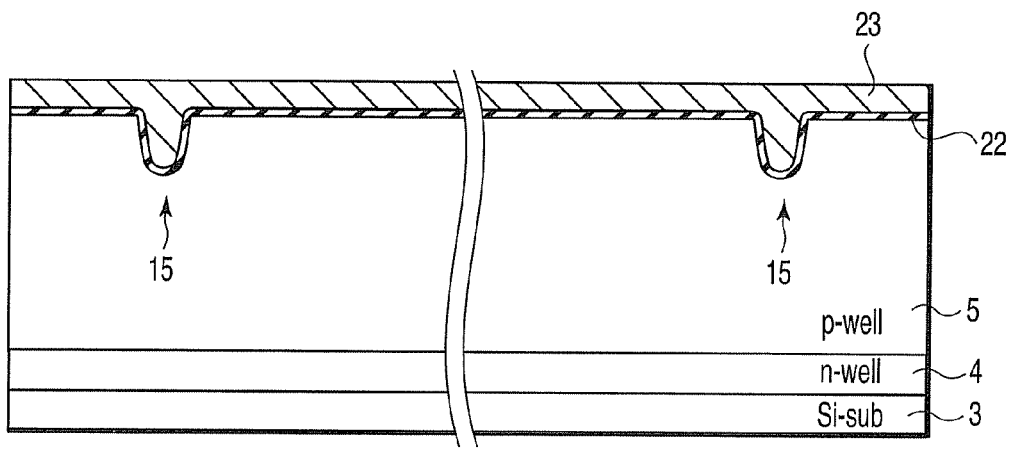
FIG. 33A is a cross-sectional view, taken along line A-A in FIG. 2, illustrating a fabrication step of the semiconductor memory device according to the second embodiment.
Figure 33B:
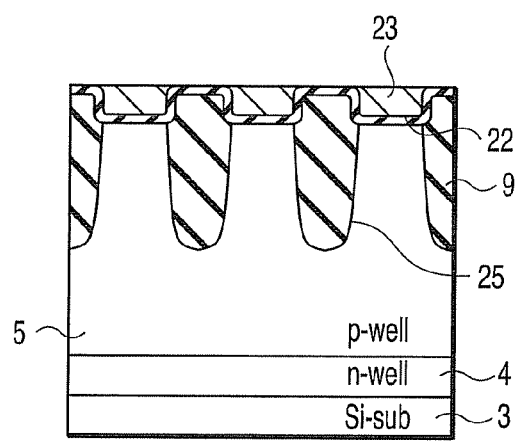
FIG. 33B is a cross-sectional view taken along line B-B in FIG. 2.
Figure 33C:
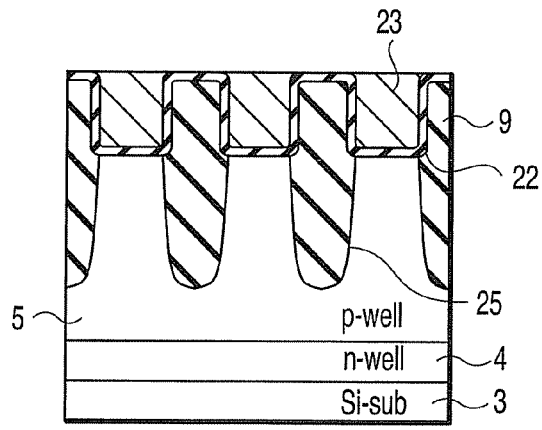
FIG. 33C is a cross-sectional view taken along line C-C in FIG. 2.
Figure 33D:
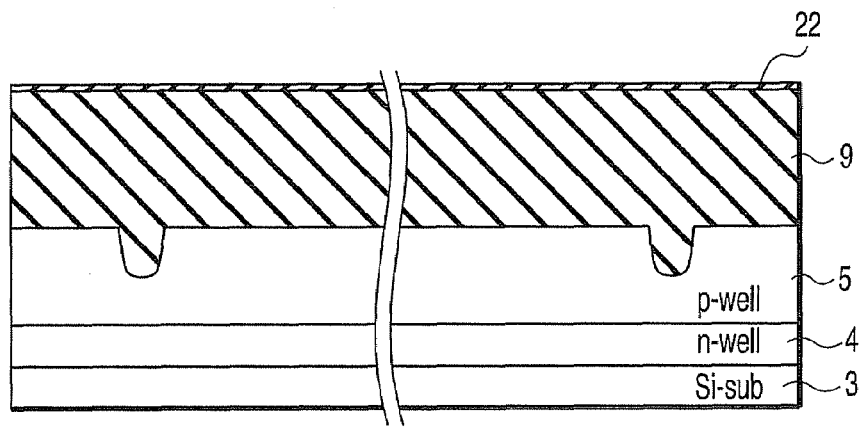
FIG. 33D is a cross-sectional view taken along line D-D in FIG. 2.

Subsequently, as shown in FIG. 27, a sacrificial oxide film 28 is formed by, e.g. thermal oxidation on the semiconductor substrate 5 including the recess structure 15. Following this step, a silicon nitride film 29 for a hard mask is formed on the sacrificial oxide film 28 by, e.g. CVD.

In the step of forming the silicon nitride film 29, a stepped part may form in the silicon nitride film 29 at an area corresponding to the recess structure 15 owing to the presence of the recess structure 15. In this case, it is effective to form the silicon nitride film with a greater thickness than a target thickness, and to planarize the silicon nitride film by CMP to a target thickness. In addition, an anti-reflection film may selectively be formed on the silicon nitride film 29.

Subsequently, as shown in FIG. 28A to 28D, a photoresist 20 is coated on the silicon nitride film 29. The photoresist 20 is then exposed and developed by lithography so as to have a resist pattern which selectively has openings 30 at areas corresponding to device isolation regions.

Subsequently, as shown in FIG. 29A to FIG. 29D, using the photoresist 20 having the above-described pattern as an etching mask, the silicon nitride film 29 is subjected to anisotropic etching, such as RIE, and a hard mask pattern 31 is formed. Further, similar anisotropic etching is performed through the sacrificial oxide film 28 and silicon substrate 5 to a predetermined depth in the substrate 5. Thus, trenches 25 for device isolation regions are formed.

At the time of this step, it is preferable to use a dry etching method with a high etching selectivity ratio between the silicon nitride film 29 and the sacrificial oxide film 28, and to perform over-etching from a time that is detected with respect to the silicon nitride film 29 in the region other than the recess structure 15. Thus, the silicon nitride film 29 at a position above the recess structure 15 is removed and the sacrificial oxide film 28 and silicon substrate 29 are dry-etched. When the silicon nitride film 29 at the position above the recess structure 15 is etched, there may be a case in which a trench is further formed in the device isolation region.

Subsequently, as shown in FIG. 30A to FIG. 30D, a silicon oxide film is buried by, e.g. CVD in the trench 25 for the device isolation region. Thereafter, the silicon oxide film is planarized by CMP so that the surface of the silicon nitride film 29 is exposed. Thus, a device isolation region 9 is formed.

Subsequently, as shown in FIG. 31A to FIG. 31D, the silicon nitride film 29 is removed by, e.g. chemical etching, and further the sacrificial oxide film 28 is removed by chemical etching.

At the time of the chemical etching, since the device isolation insulation film 9 is also formed of the silicon oxide film, the device isolation insulation film 9 is similarly etched.

Subsequently, as shown in FIG. 32A to FIG. 32D, an insulation film 22 is formed by, e.g. thermal oxidation over the entire surface of the substrate 5. For example, an oxynitride film, etc. may be applicable as the insulation film 22.

Thereafter, as shown in FIG. 33A to 33D, a polysilicon layer 23, which becomes an underlayer of the floating electrode 7 or the gate electrode 12, is formed on the insulation film 22 by, e.g. CVD. The polysilicon layer 23 is formed such that the film thickness of the polysilicon layer 23 may once become higher than the device isolation insulation film 9. Then, the polysilicon layer 23 is polished by, e.g. a damascene method to the level of the surface of the device isolation insulation film 9.

The thickness of the polysilicon layer 23 can advantageously be made uniform by the damascene process.

Subsequently, using the same fabrication steps as in the first embodiment, the semiconductor memory device as shown in FIG. 1 to FIG. 4 is manufactured.

The same advantageous effects (1) to (4) as described above can be obtained by the manufacturing method of the semiconductor memory device according to the present embodiment.

Further, the manufacturing method of the semiconductor memory device according to the present embodiment differs from that of the first embodiment in that the gate insulation film 13 of the select transistor S1, S2 on the recess structure 15 is formed in a later step than the device isolation insulation film 9. Therefore, the following advantageous effect (5) can be obtained.

(5) The film quality of the gate insulation film 13 can be improved.

Specifically, in the manufacturing method of the semiconductor memory device according to the present embodiment, the recess structure 15 is first formed in the substrate 5 (FIG. 23 to FIG. 26).

Then, the device isolation insulation film 9 is formed in the substrate 5 (FIG. 27 to FIG. 31).

Subsequently, the insulation film 22, which becomes the gate insulation film 13 of the select transistor S1, S2, is formed on the substrate 5 including the recess structure 15 (FIG. 32).

Thus, it is possible to prevent the portion of the gate insulation film 13 exposed to the surface of the trench 25 for the element separation region from being etched in the etching step (FIG. 29A to FIG. 29D) at the time of forming the trench 25 for the device isolation region. Therefore, the film quality of the gate insulation film 13 can be improved.

Further, as shown in FIG. 31A to FIG. 31D, the silicon nitride film 29 and sacrificial oxide film 28 are once removed by, e.g. chemical etching. Thereafter, the insulation film 22, which becomes the gate insulation film 13, is formed by, e.g. thermal oxidation over the entire surface of the substrate 5 (FIG. 32A to FIG. 32D). Therefore, the insulation film 22 can be formed in the state in which impurities, etc. on the surface of the substrate 5 including the recess structure 15 are removed, and the film quality of the gate insulation film 13 can be improved.

Third Embodiment

An Example of a Select Transistor Having a Mesa (Projection) Structure

Next, a semiconductor memory device according to a third embodiment of the invention and a manufacturing method thereof are described. This embodiment relates to an example of a select transistor including a mesa (projection or trapezoid) structure. A detailed description of the parts common to those in the first embodiment is omitted here.

<Example of Structure>

To begin with, an example of the structure of the semiconductor memory device according to this embodiment is described with reference to FIG. 34. The select transistor S2 is described by way of example.

Figure 34:
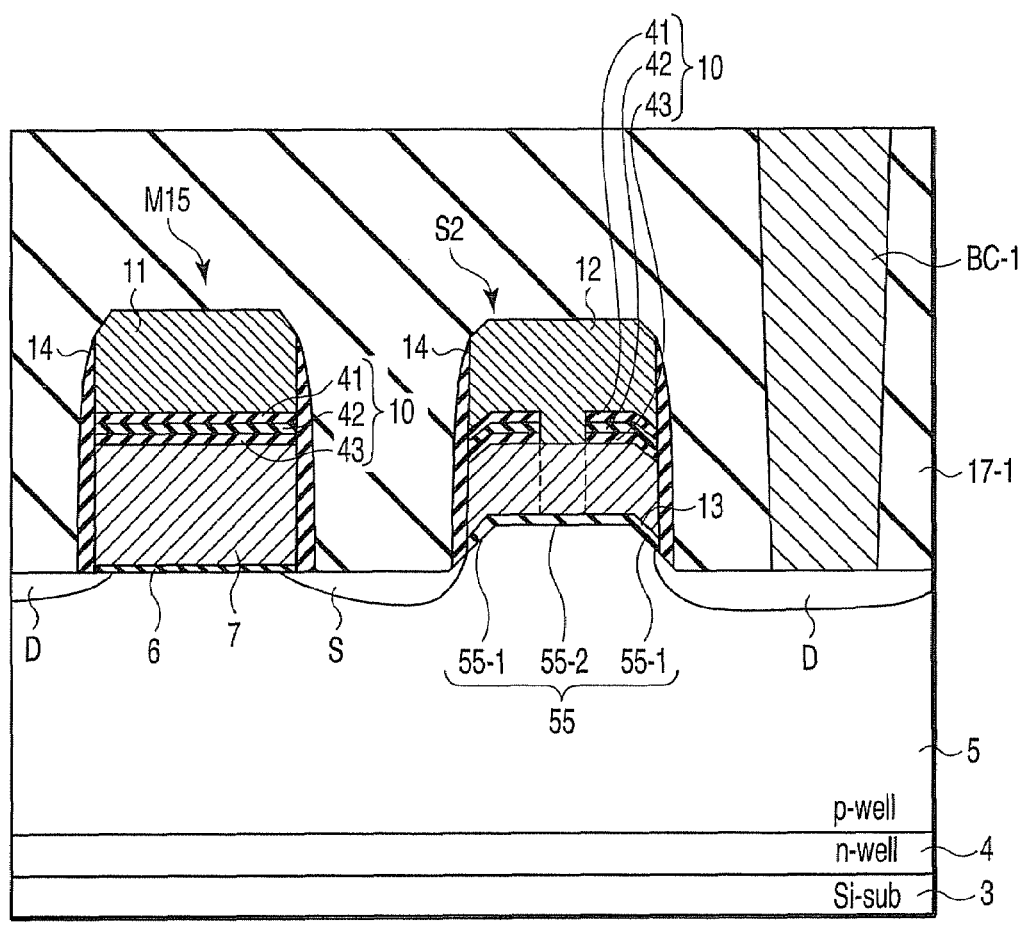
FIG. 34 is a cross-sectional view showing a semiconductor memory device according to a third embodiment of the invention.

As shown in FIG. 34, the third embodiment differs from the first embodiment in that the select transistor S2 includes a mesa (projection or trapezoid) structure 55 in which only a central part of the select transistor S2 is higher than the substrate 5 on which the memory cell transistor M15 is provided. The mesa structure 55 is composed of a mesa structure oblique surface 55-1 and a mesa structure top surface 55-2.

Accordingly, central parts of the gate insulation 13, gate electrode 12 and inter-gate insulation film 10, which are provided over the mesa structure 55, are formed to have projection shapes.

In addition, the third embodiment differs from the first embodiment in that the inter-gate insulation film 10 has a stacked-layer structure comprising an $SiO_2$ film 43, an SiN film 42 provided on the $SiO_2$ film 43, and an $SiO_2$ film 41 provided on the SiN film 42.

The select transistor S1 has the same structure as described above.

<Manufacturing Method>

Next, a manufacturing method of the semiconductor memory device according to this embodiment is described, taking the device shown in FIG. 34 as an example.

To start with, a photoresist is coated on the silicon substrate (P-type well) 5.

The photoresist is then exposed and developed to form a resist pattern which has openings at areas corresponding to channel regions so that a central part of the selector transistor S1, S2 may have a mesa (projection) shape.

Subsequently, using the photoresist having the resist pattern as a mask, the substrate 5 is subjected to anisotropic etching such as RIE. Thus, the mesa (projection) structure is formed, in which only a central part of the select transistor S1, S2 is higher than the substrate 5 on which the memory cell transistors M0 to M15 are provided.

Subsequently, the photoresist is removed by an asher, etc., and then an oxide film, which becomes a gate insulation film, is formed by thermal oxidation on the silicon substrate (P-type well) 5.

Then, on the oxide film, a polysilicon layer, which becomes an underlayer of the floating electrode 7 or gate electrode 12, is formed by, e.g. CVD.

Subsequently, a stacked-layer film comprising an $SiO_2$ film 41/SiN film 42/$SiO_2$ film 43 is formed on the polysilicon layer by, e.g. CVD.

Subsequently, the stacked-layer structure is opened at a central part of the select transistor S1, S2, and an inter-gate insulation film 10 is formed.

Subsequently, a polysilicon layer, which becomes an upper layer of the control electrode 11 or gate electrode 12 is formed on the stacked-layer structure.

Thereafter, the same fabrication steps as in the first embodiment are carried out, and the semiconductor memory device shown in FIG. 34 is manufactured.

The same advantageous effect (1) as described above can be obtained by the semiconductor memory device and the manufacturing method according to the present embodiment.

Specifically, (1) the cut-off characteristics can be improved and microfabrication can advantageously be achieved.

The select transistor S1, S2 according to the present embodiment includes the mesa (projection) structure 55 in which only a central part of the select transistor S1, S2 is higher than the memory cell transistor M15.

Thus, the channel of the select transistor S1, S2 can be made to have a three-dimensional structure. While the area of occupation in the bit line direction is decreased, the effective channel length can be increased. As a result, the cut-off characteristics can be improved, and microfabrication can advantageously be achieved.

The structure and the manufacturing method according to this embodiment are usable.

Fourth Embodiment

An Example of a Memory Cell Transistor Having a Mesa (Projection) Structure

Next, a semiconductor memory device according to a fourth embodiment of the invention and a manufacturing method thereof are described. This embodiment relates to an example of a memory cell transistor including a mesa (projection or trapezoid) structure. A detailed description of the parts common to those in the third embodiment is omitted here.

<Example of Structure>

To begin with, an example of the structure of the semiconductor memory device according to this embodiment is described with reference to FIG. 35. The select transistor S2 and memory cell transistor M15 are described by way of example.

Figure 35:
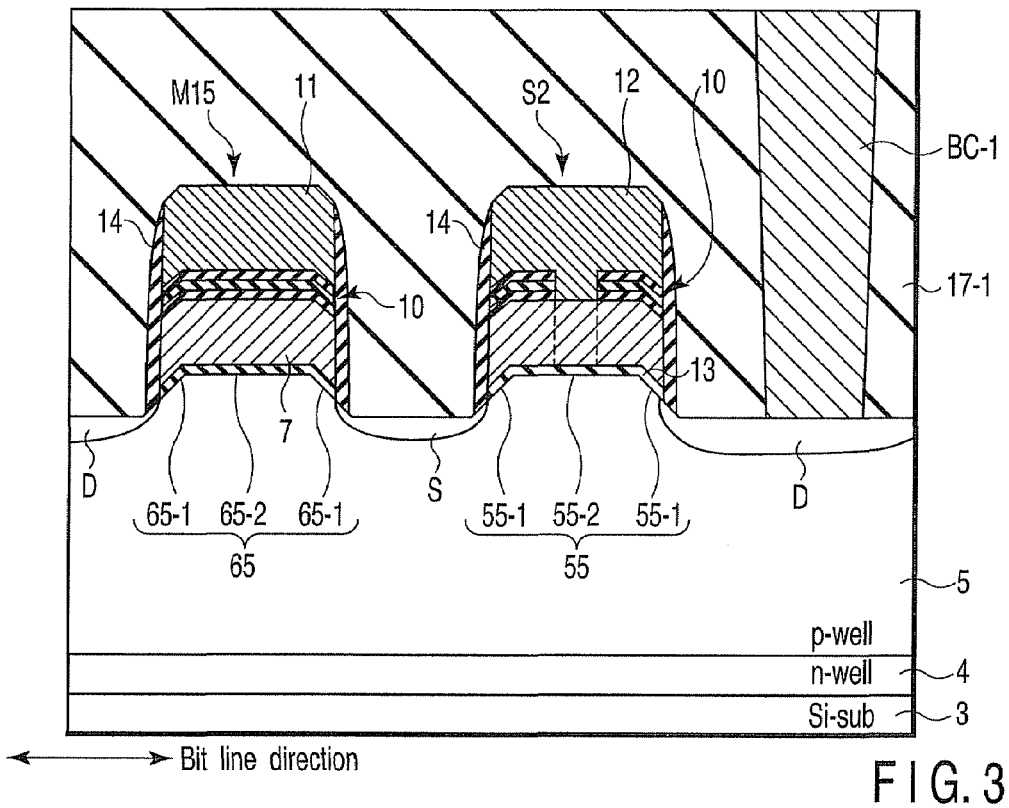
FIG. 35 is a cross-sectional view showing a semiconductor memory device according to a fourth embodiment of the invention.

As shown in FIG. 35, the fourth embodiment differs from the third embodiment in that the memory cell transistor M15 includes a mesa (projection) structure 65 in which a central part of the memory cell transistor M15 is higher than the surrounding region. The mesa structure 65 is composed of a mesa structure oblique surface 65-1 and a mesa structure top surface 65-2.

Accordingly, central parts of the tunnel insulation film 6, floating electrode 7, inter-gate insulation film 10 and control electrode 11, which are provided over the mesa structure 65, are formed to have projection shapes.

The memory cell transistor M0, which is connected to the select transistor S1, has the same structure as the memory cell transistor M15.

<Manufacturing Method>

Next, a manufacturing method of the semiconductor memory device according to this embodiment is described, taking the device shown in FIG. 35 as an example.

The manufacturing method of the semiconductor memory device according to this embodiment differs from that of the third embodiment in that the resist pattern, which is formed in the photoresist, has openings not only at areas corresponding to channel regions of the select transistors S1, S2, but also at areas corresponding to channel regions of the memory cell transistors M0, M15.

The same advantageous effect (1) as described above can be obtained by the semiconductor memory device according to this embodiment and the manufacturing method thereof. Furthermore, according to the present embodiment, the following advantageous effects (6) and (7) can be obtained.

(6) The reliability of the memory cell transistor M0, M15 can be enhanced.

Figure 36:
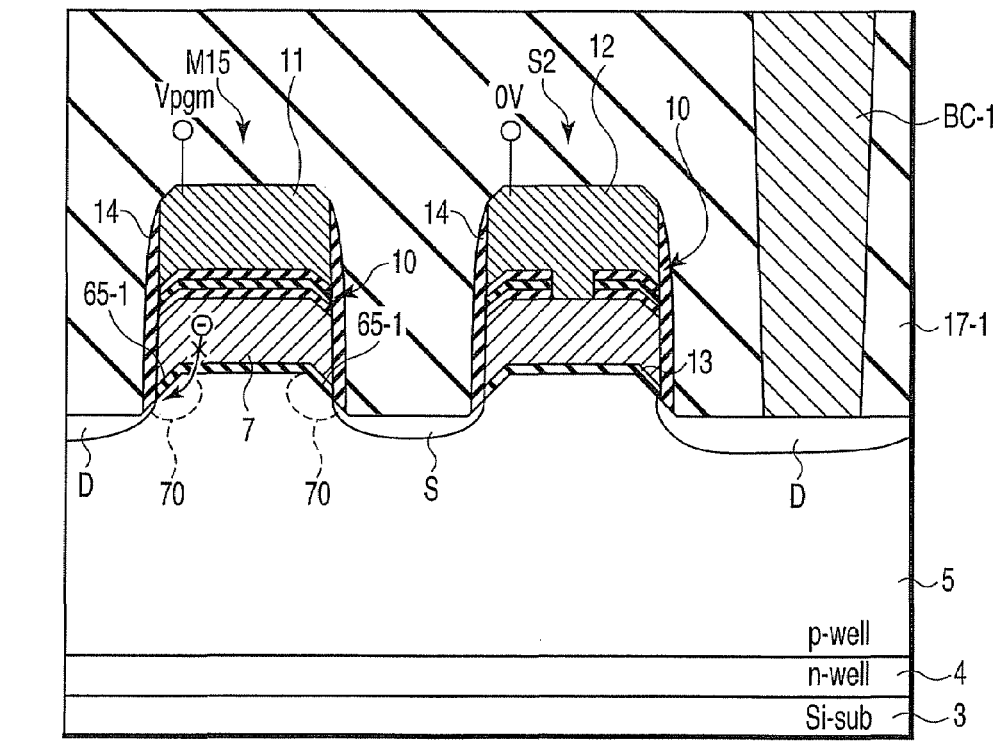
FIG. 36 is a cross-sectional view illustrating an advantageous effect of the semiconductor memory device according to the fourth embodiment.

As shown in FIG. 36, at the time of the write operation, 0V is applied to the gate electrode 12 of the select transistor S2, and a write voltage Vpgm, which is a high voltage, is applied to the control electrode of the memory cell transistor M15 that neighbors the select transistor S2.

At the time of the write operation, since the memory cell transistor M15 has the mesa (projection) structure 65, the electric field in the vicinity 70 of the mesa structure oblique surface 65-1 can be reduced while the short-channel effect is being suppressed.

Thus, GIDL (Gate Induced Drain Leakage) occurring due to hot electrons can be prevented, and erroneous write of the memory cell transistor M0, M15 can be prevented. Therefore, the reliability of the memory cell transistors can be enhanced.

(7) The effective channel length of the memory cell transistor M0, M15 can be increased, and microfabrication can advantageously be achieved.

According to the present embodiment, the memory cell transistor M0, M15 includes the mesa (projection) structure 65 in which only the central portion of the memory cell transistor M0, M15 is raised.

In addition to the select transistor S1, S2, the memory cell transistor, M0 to M15, can be made to have the three-dimensional structure. While the area of occupation in the bit line direction is decreased, the effective channel length can be increased.

In the above-described embodiments, the floating electrode 7 is formed of polysilicon. However, the floating electrode 7 is not limited to this example. A charge-accumulation layer, which is formed of, e.g. a silicon nitride film, may be applied to the floating electrode 7.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell string provided on a semiconductor substrate;
a first select transistor including a gate insulation film, which is provided on the semiconductor substrate having a recess structure which is lower, only at a central portion thereof, than the semiconductor substrate on which the memory cell string is provided, and a gate electrode provided on the gate insulation film, the first select transistor being connected to one end of a current path of the memory cell string; and
an inter-gate insulation film which is provided in the gate electrode and is opened at a central part thereof.

2. The device according to claim 1, further comprising a second select transistor including a gate insulation film, which is provided on the semiconductor substrate having a recess structure which is lower, only at a central portion thereof, than the semiconductor substrate on which the memory cell string is provided, and a gate electrode provided on the gate insulation film, the second select transistor being connected to the other end of the current path of the memory cell string.

3. The device according to claim 1, wherein the recess structure has a width narrower than that of the gate electrode, and comprises a recess structure oblique surface which is provided at a predetermined angle from a surface of the semiconductor substrate, and a recess structure bottom surface which is provided at a predetermined depth from the surface of the semiconductor substrate.

4. The device according to claim 3, wherein the predetermined angle is an angle between a direction along the surface of the semiconductor substrate and a direction along the recess structure oblique surface, and the predetermined angle is set in a range of between 45.degree. and 85.degree.

5. The device according to claim 3, wherein the predetermined depth is 5 nm to 20 nm.

6. The device according to claim 3, wherein a length in a channel direction of the recess structure bottom surface is 6 nm or more.

7. The device according to claim 3, wherein a length in a channel length direction of one of both side portions of the semiconductor substrate surface, on which the select transistor is provided and from which the recess structure is excluded, is 5 nm or more.

8. The device according to claim 1, wherein the recess structure is provided at a position below the split part of the inter-gate insulation film.

9. The device according to claim 1, further comprising a source or a drain, which is provided in the semiconductor substrate in a manner to sandwich the gate electrode.

10. The device according to claim 1, wherein the memory cell string includes a plurality of memory cell transistors having current paths connected in series.

11. A semiconductor memory device comprising:
a memory cell string provided on a semiconductor substrate; and
a first select transistor including a gate insulation film, which is provided on the semiconductor substrate having a mesa structure which is higher, only at a central portion thereof, than the semiconductor substrate on which the memory cell string is provided, and a gate electrode provided on the gate insulation film, the first select transistor being connected to one end of a current path of the memory cell string.

12. The device according to claim 11, further comprising a second select transistor including a gate insulation film, which is provided on the semiconductor substrate having a mesa structure which is higher, only at a central portion thereof, than the semiconductor substrate on which the memory cell string is provided, and a gate electrode provided on the gate insulation film, the second select transistor being connected to the other end of the current path of the memory cell string.

13. The device according to claim 11, wherein the mesa structure comprises a mesa structure oblique surface which is provided at a predetermined angle from a surface of the semiconductor substrate, and a mesa structure bottom surface which is provided at a predetermined height from the surface of the semiconductor substrate.

14. The device according to claim 11, further comprising an inter-gate insulation film which is provided in the gate electrode and is opened at a central part thereof.

15. The device according to claim 14, wherein central parts of the gate insulation film, the gate electrode and the inter-gate insulation film have projection shapes.

16. The device according to claim 11, wherein the memory cell string includes a plurality of memory cell transistors having current paths connected in series.

17. The device according to claim 16, wherein each of the plurality of memory cell transistors is provided on the semiconductor substrate having a mesa structure which is higher, only at a central portion thereof, than a surrounding region.

18. The device according to claim 17, wherein the mesa structure comprises a mesa structure oblique surface which is provided at a predetermined angle from a surface of the semiconductor substrate, and a mesa structure bottom surface which is provided at a predetermined height from the surface of the semiconductor substrate.

19. The device according to claim 18, wherein each of the plurality of memory cell transistors includes a tunnel insulation film, a floating electrode, an inter-gate insulation film and a control electrode, which are provided successively on the mesa structure, and central parts of the tunnel insulation film, the floating electrode, the inter-gate insulation film and the control electrode have projection shapes.

* * * * *